US012648194B2

(12) United States Patent
Bao et al.

(10) Patent No.: US 12,648,194 B2
(45) Date of Patent: Jun. 2, 2026

(54) MULTIPLE GATE DIELECTRICS FOR MONOLITHIC STACKED DEVICES

(71) Applicant: International Business Machines Corporation, Armonk, NY (US)

(72) Inventors: Ruqiang Bao, Niskayuna, NY (US); Jingyun Zhang, Albany, NY (US); Junli Wang, Slingerlands, NY (US); Chen Zhang, Santa Clara, CA (US); Uzma Rana, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 422 days.

(21) Appl. No.: 18/213,493

(22) Filed: Jun. 23, 2023

(65) Prior Publication Data

US 2024/0429277 A1     Dec. 26, 2024

(51) Int. Cl.
| | |
|---|---|
| *H01L 29/06* | (2006.01) |
| *H01L 25/07* | (2006.01) |
| *H01L 25/18* | (2023.01) |
| *H01L 29/423* | (2006.01) |
| *H01L 29/66* | (2006.01) |
| *H01L 29/775* | (2006.01) |
| *H01L 29/786* | (2006.01) |
| *H10D 30/43* | (2025.01) |
| *H10D 30/67* | (2025.01) |
| *H10D 62/10* | (2025.01) |
| *H10D 64/01* | (2025.01) |
| *H10W 90/00* | (2026.01) |

(52) U.S. Cl.
CPC ........... *H10D 62/121* (2025.01); *H10D 30/43* (2025.01); *H10D 30/6735* (2025.01); *H10D 30/6757* (2025.01); *H10D 64/017* (2025.01); *H10W 90/00* (2026.01)

(58) Field of Classification Search
CPC .. H10D 62/121; H10D 30/43; H10D 30/6735; H10D 30/6757; H10D 64/017; H10D 30/014; H10D 84/85; H10D 88/00; H10D 84/0144; H10D 84/038; H10D 84/83; H10D 84/014; H01L 25/074; H01L 25/18
USPC ........................................................ 257/288
See application file for complete search history.

(56) References Cited

U.S. PATENT DOCUMENTS

| | | | |
|---|---|---|---|
| 8,314,001 B2 | 11/2012 | Christensen et al. | |
| 8,492,220 B2 | 7/2013 | Erickson et al. | |
| (Continued) | | | |

FOREIGN PATENT DOCUMENTS

| | | |
|---|---|---|
| CN | 121286123 A | 1/2026 |
| KR | 2025-0114077 A | 7/2025 |
| WO | 2024/260807 A1 | 12/2024 |

OTHER PUBLICATIONS

International Search Report dated Sep. 11, 2024, received in a corresponding foreign application, namely International application No. PCT/EP2024/066147, 19 pages.

(Continued)

*Primary Examiner* — Tong-Ho Kim
(74) *Attorney, Agent, or Firm* — Scully, Scott, Murphy & Presser, P.C.; L. Jeffrey Kelly, Esq.

(57) ABSTRACT

A semiconductor structure including a plurality of stacked devices having different gate dielectrics is provided. The different gate dielectrics for the stacked devices are designed to improve the performance and the reliability for each of the stacked devices.

20 Claims, 23 Drawing Sheets

(56)          References Cited

U.S. PATENT DOCUMENTS

| | | | |
|---|---|---|---|
| 10,192,819 B1 | 1/2019 | Chanemougame et al. | |
| 10,217,674 B1 | 2/2019 | Hook et al. | |
| 10,770,353 B2 | 9/2020 | Wang | |
| 11,527,535 B2 | 12/2022 | Frougier et al. | |
| 2009/0057765 A1 | 3/2009 | Zhu et al. | |
| 2020/0403097 A1 | 12/2020 | Wang et al. | |
| 2021/0202323 A1* | 7/2021 | Wu | H10D 62/292 |
| 2021/0202756 A1 | 7/2021 | Chang et al. | |
| 2022/0052186 A1 | 2/2022 | Gardner et al. | |
| 2022/0085006 A1 | 3/2022 | Kim | |
| 2022/0310457 A1 | 9/2022 | Chang et al. | |
| 2023/0068484 A1 | 3/2023 | Bao et al. | |
| 2023/0093897 A1* | 3/2023 | Kim | H10D 84/853 |
| | | | 257/288 |

OTHER PUBLICATIONS

Intellectual Property Office, "Request for the Submission of an Opinion," Oct. 12, 2025, 14 Pages, KR Application No. 10-2025-7021000.

* cited by examiner

MULTIPLE GATE DIELECTRICS FOR MONOLITHIC STACKED DEVICES

BACKGROUND

The present application relates to semiconductor technology, and more particularly to a semiconductor structure including a plurality of stacked devices having different gate dielectrics that are designed for performance and reliability enhancement for each stacked device.

Stacking of devices such as, for example, field effect transistors (FETs), is an attractive architecture for future complementary metal oxide semiconductor (CMOS) scaling, and potentially for ultimately scaled technology. By directly stacking devices one over the other (for example, pFETs over nFETs, nFETs over pFETs, pFETs over pFETs, or nFETs over nFETs) significant area scaling can be achieved.

SUMMARY

A semiconductor structure including a plurality of stacked devices having different gate dielectrics is provided. The different gate dielectrics include interfacial dielectric layers and high-k gate dielectric layers. The difference can be in thickness and/or material composition. The different gate dielectrics for the stacked devices are designed to improve the performance and the reliability for each of the stacked devices. Throughout this application, the term "high-k" denotes a material having a dielectric constant, as measured in vacuum, of greater than 4.0.

In one aspect of the present application, a semiconductor structure is provided. In one embodiment of the present application, the semiconductor structure includes a first device region including a first pair of logic devices stacked one on top the other and having a first threshold voltage. The first pair of logic devices include a first gate region including a first interfacial dielectric layer having a first thickness, a first high-k gate dielectric layer located on the first interfacial dielectric layer and a first gate electrode located on the first high-k gate dielectric layer. The semiconductor structure of the present disclosure further includes a second device region including a second pair of logic devices stacked one on top the other and having a second threshold voltage which is different from the first threshold voltage. The second pair of logic devices include a second interfacial dielectric layer having a second thickness, a second high-k gate dielectric layer located on the second interfacial dielectric layer and a second gate electrode located on the second high-k gate dielectric layer. In this embodiment, the second high-k gate dielectric layer has a thickness that is greater than a thickness of the first high-k gate dielectric layer. The structure even further includes a third device region including a pair of I/O devices stacked one on top the other. The pair of I/O devices include a third interfacial dielectric layer having a third thickness, a third high-k gate dielectric layer located on the third interfacial dielectric layer and a third gate electrode located on the third high-k gate dielectric layer. In this embodiment, the third thickness of the third interfacial dielectric layer is greater than the first thickness of the first interfacial dielectric layer and the second thickness of the second interfacial dielectric layer.

In another embodiment of the present disclosure, the semiconductor structure includes a first device region including a first pair of logic devices stacked one on top the other and having a first threshold voltage. The first pair of logic devices includes a first gate region including a first interfacial dielectric layer having a first thickness, a first high-k gate dielectric layer located on the first interfacial dielectric layer and a first gate electrode located on the first high-k gate dielectric layer. The structure further includes a second device region including a second pair of logic devices stacked one on top the other and having a second threshold voltage which is different from the first threshold voltage. The second pair of logic devices include a second interfacial dielectric layer having a second thickness, a second high-k gate dielectric layer located on the second interfacial dielectric layer and a second gate electrode located on the second high-k gate dielectric layer. The structure even further includes a third device region including a pair of I/O devices stacked one on top the other. The pair of I/O devices include a third interfacial dielectric layer having a third thickness, a third high-k gate dielectric layer located on the third interfacial dielectric layer and a third gate electrode located on the third high-k gate dielectric layer. In accordance with this embodiment of the present application, the third thickness of the third interfacial dielectric layer is greater than the first thickness of the first interfacial dielectric layer and the second thickness of the second interfacial dielectric layer, and at least one of the first high-k gate dielectric layer, the second high-k gate dielectric layer and the third high-k gate dielectric layer is composed of a compositionally different high-k gate dielectric material.

DETAILED DESCRIPTION

Figure 1:
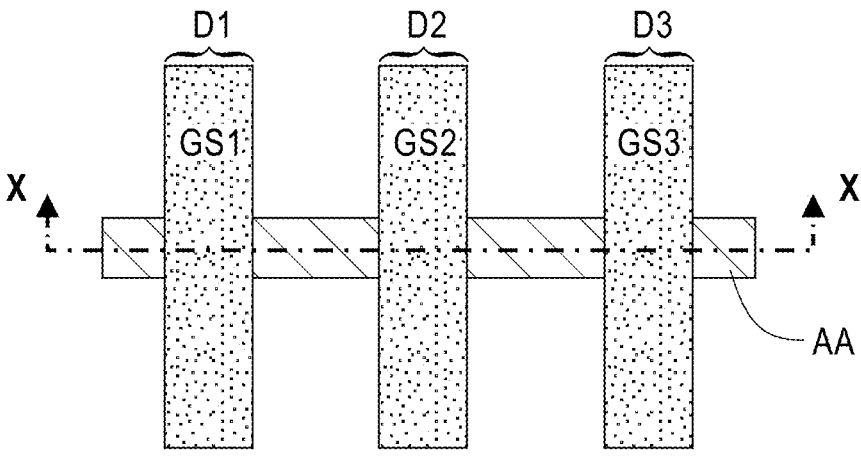
FIG. 1 is a top-down view of a device layout that can be employed in the present application, the device layout including a plurality of gate structures, GS1, GS2 and GS3, that are oriented parallel to each other and perpendicular to an active area, AA; the illustrated device layout includes cut X-X.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

In today's technology, high performance computing for the server and low power for mobile are normally sharing the same platform to reduce the R&D cost and manufacturing cost.

Conventionally, low power for mobile applications has the product first in one generation technology which defines the base for the technology platform. Normally, the high-performance computing for server applications is the last product for one generation. However, the reliability for high-performance computing for server applications is also the last item to qualify the technology. If there is a reliability issue for high-performance computing for server applications, it is impossible to fix by developing the processes starting from the beginning, especially for the technology with dipole for threshold voltage, Vt, modulation, since it is time consuming as well as expensive. Ways to fix the reliability are needed.

Specifically, different functional devices require different gate dielectrics due to performance and reliability need, for example, a thin oxide device, a thicker oxide device (I/O device), SRAM, high Vt devices or low Vt devices. How to provide a different gate dielectric is critical to have competitive technology for stacked devices.

Figure 12A:
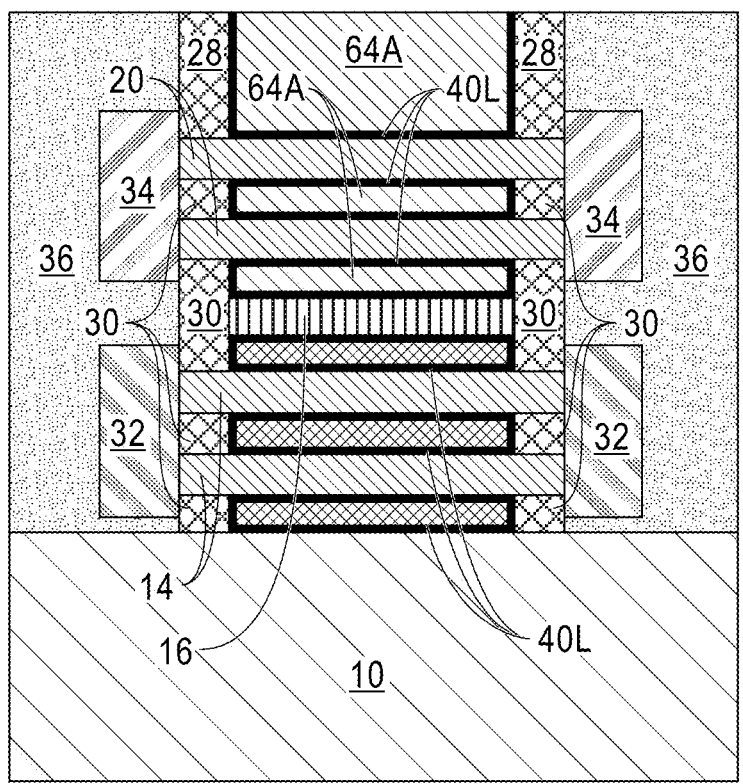
FIGS. 12A, 12B and 12C are cross sectional views of the exemplary semiconductor structure illustrated in FIGS. 11A, 11B and 11C, respectively, after forming a first gate electrode in D1, a second gate electrode in D2 and a third gate electrode in D3.

In one embodiment (i.e., a first embodiment) of the present application, the semiconductor structure includes a first device region D1 including a first pair of logic devices stacked one on top the other and having a first threshold voltage (See FIG. 12A). The first pair of logic devices include a first gate region (see FIG. 13A) including a first interfacial dielectric layer, IL-1, having a first thickness, a first high-k gate dielectric layer 40L located on the first interfacial dielectric layer, IL-1, and a first gate electrode 64A located on the first high-k gate dielectric layer 40L. The semiconductor structure of the present disclosure further includes a second device region D2 including a second pair of logic devices stacked one on top the other and having a second threshold voltage which is different from the first threshold voltage (See FIG. 12B). The second pair of logic devices include a second interfacial dielectric layer, IL-2, having a second thickness, a second high-k gate dielectric layer 48L located on the second interfacial dielectric layer, IL-2, and a second gate electrode 64B located on the second high-k gate dielectric layer 48L. In this first embodiment, the second high-k gate dielectric layer 48L has a thickness that is greater than a thickness of the first high-k gate dielectric layer 40L. The structure even further includes a third device region D3 including a pair of I/O devices stacked one on top the other (See FIG. 12C). The pair of I/O devices include a third interfacial dielectric layer 55 having a third thickness, a third high-k gate dielectric layer 56L located on the third interfacial dielectric layer 55 and a third gate electrode 46C located on the third high-k gate dielectric layer 56L (See FIGS. 12C and 13C). In this first embodiment, the third thickness of the third interfacial dielectric layer 55 is greater than the first thickness of the first interfacial dielectric layer, IL-1, and the second thickness of the second interfacial dielectric layer, IL-2. Due to different application or purpose or functionality, the reliability requirement of devices is different. I/O devices require a thicker interfacial dielectric layer to have enough breakdown voltage to suppress time-dependent gate oxide breakdown. For logic devices, devices with different threshold voltage require different breakdown voltage and negative-bias temperature instability or positive-bias temperature instability. Therefore, by optimizing the gate stack dielectric to remove the reliability limitation can further optimize the overall device performance and improve circuit performance.

In another embodiment (i.e., a second embodiment) and as shown in FIGS. 12A-13C, the semiconductor structure includes a first device region D1 including a first pair of logic devices stacked one on top the other and having a first threshold voltage. The first pair of logic devices includes a first gate region including a first interfacial dielectric layer, IL-1, having a first thickness, a first high-k gate dielectric layer 40L located on the first interfacial dielectric layer, IL-1, and a first gate electrode 64A located on the first high-k gate dielectric layer 40L. The structure further includes a second device region D2 including a second pair of logic devices stacked one on top the other and having a second threshold voltage which is different from the first threshold voltage. The second pair of logic devices include a second interfacial dielectric layer, IL-2, having a second thickness, a second high-k gate dielectric layer 48L located on the second interfacial dielectric layer, IL-2, and a second gate electrode 64B located on the second high-k gate dielectric layer 48L. The structure even further includes a third device region D3 including a pair of I/O devices stacked one on top the other. The pair of I/O devices include a third interfacial dielectric layer 55 having a third thickness, a third high-k gate dielectric layer 56L located on the third interfacial dielectric layer 55 and a third gate electrode 64C located on the third high-k gate dielectric layer 56L. In accordance with this second embodiment of the present application, the third thickness of the third interfacial dielectric layer 55 is greater than the first thickness of the first interfacial dielectric layer, IL-1, and the second thickness of the second interfacial dielectric layer, IL-2, and at least one of the first high-k gate dielectric layer 40L, the second high-k gate dielectric layer 48L and the third high-k gate dielectric layer 56L is composed of a compositionally different high-k gate dielectric material. A thicker interfacial layer can offer better breakdown voltage but can significantly have more impact on device performance than high-k material thickness. But high-k thickness can significantly cause negative-bias temperature instability or positive-bias temperature instability. Therefore, how to balance the device performance by using interfacial dielectric layer thickness and high-k thickness is based on device functionality.

Figure 12C:
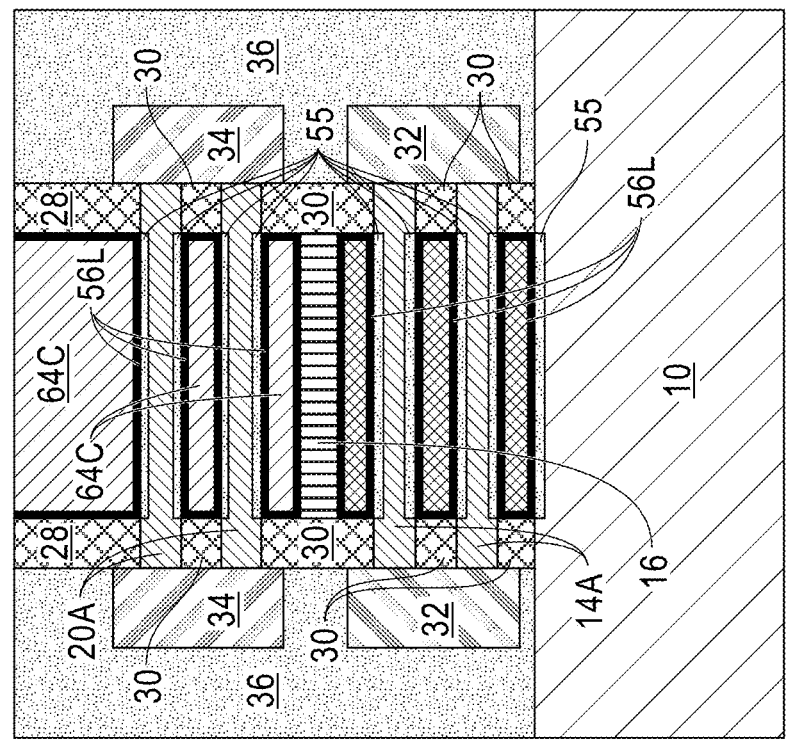
Figure 12B:
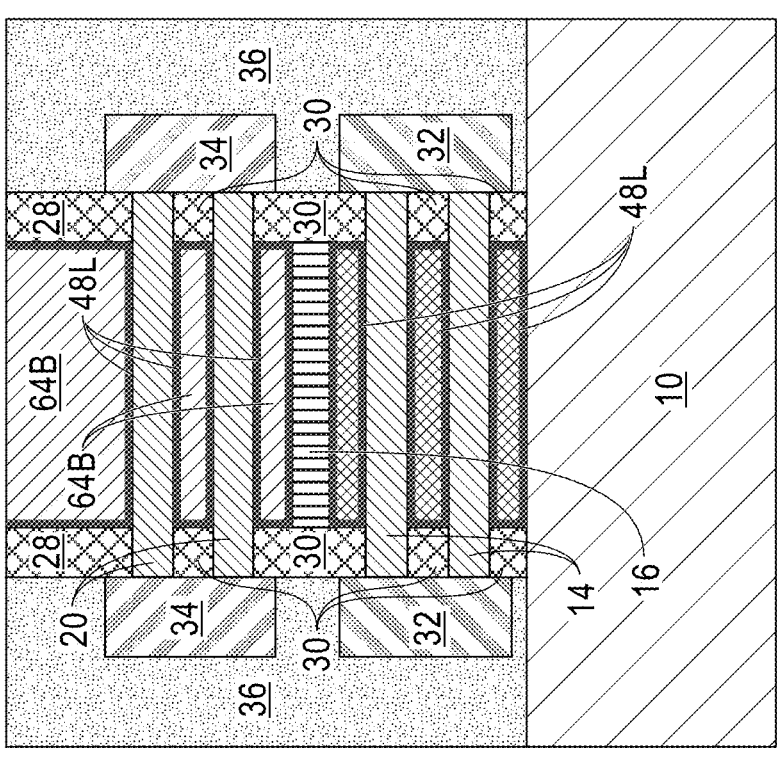

In some embodiments (applicable to both the first and second embodiments mentioned above) and as shown in FIGS. 12A, the first pair of logic devices include a first nanosheet stack containing at least one second semiconductor channel material nanosheet 20 located above at least one first semiconductor channel material nanosheet 14. In such an embodiment, the first interfacial dielectric layer, IL-1, shown in FIG. 13A wraps around a portion of the at least one second semiconductor channel material nanosheet 20 and a portion of the at least one first semiconductor material nanosheet 14 of the first nanosheet stack. Also, and as shown in FIG. 12B, the second pair of logic devices includes a second nanosheet stack containing at least one second semiconductor channel material nanosheet 20 located above at least one first semiconductor channel material nanosheet 14. In such an embodiment, the second interfacial dielectric layer, IL-2, shown in FIG. 13B wraps around a portion of the at least one second semiconductor channel material nanosheet 20 and a portion of the at least one first semiconductor material nanosheet 14 of the second nanosheet stack. Also, and as shown in FIG. 12C, the pair of I/O devices includes a third nanosheet stack containing at least one second semiconductor channel material nanosheet 20 located above at least one first semiconductor channel material nanosheet 14. In such an embodiment, and as is shown in FIG. 12C, the third interfacial dielectric layer 55 wraps around a portion of the at least one second semiconductor channel material nanosheet 20 and a portion of the at least one first semiconductor material nanosheet 14 of the third nanosheet stack. In the present application, each nanosheet stack is derived from a second nanosheet material stack stacked on top of a first nanosheet material stack. Nanosheet gate-all-around (GAA) devices offer larger effective device width (Weff) per active footprint and better performance compared to FinFET, with a less complex photolithography strategy, leveraging Extreme Ultraviolet Lithography (EUV). Nanosheet devices provides better power-performance design point due to superior electrostatic control in GAA devices, where the gate surrounds the channel on all sides versus only three sides in FinFET. Therefore, in the future generation technology, nanosheet should be foundation device structure for stacked transistors.

In some embodiments (applicable to both the first and second embodiments mentioned above) and as is shown FIGS. 12A, 12B and 12C, the structure can further include a middle dielectric isolation layer 16 located between the at least one first semiconductor channel material nanosheet 14 and the at least one second semiconductor channel material nanosheet 20 in each of the first nanosheet stack, the second nanosheet stack and the third nanosheet stack. The middle dielectric isolation layer 16 electrically separates each stacked pair of devices from each other.

In some embodiments (applicable to both the first and second embodiments mentioned above) and as is shown FIG. 12C the at least one first semiconductor material channel nanosheet 14 and the at least one second semiconductor channel material nanosheet 20 of the third nanosheet stack are dumbbell shaped having a middle portion of a first thickness and end portions of a second thickness that is greater than the first thickness of the middle portion, and wherein the third interfacial dielectric layer 55 wraps around the middle portion. This embodiment provides greater surface area semiconductor channel material nanosheet.

In embodiments (applicable to both the first and second embodiments mentioned above), each of the first device region D1, the second device region D2 and the third device region D3 are present on a same semiconductor substrate, i.e., semiconductor substrate 10. The enables monolithic device stacking.

In some embodiments of the present application (applicable to both the first and second embodiments mentioned above), the first gate electrode 64A, the second gate electrode 64B and the third gate electrode 64C are composed of a compositionally same gate electrode material. In other embodiments of the present application (applicable to both the first and second embodiments mentioned above), at least one of the first gate electrode 64A, the second gate electrode 64B and the third gate electrode 64C is composed of a compositionally different gate electrode material. These embodiments illustrate the flexibility of the present application.

In some embodiments of the present application (applicable to the first embodiment mentioned above), the first high-k gate dielectric layer 40L, the second high-k gate dielectric layer 48L, and the third high-k gate dielectric layer 56L are composed of a compositionally same high-k gate dielectric material. In other embodiments of the present application (applicable to the first embodiment mentioned above), at least one the first high-k gate dielectric layer 40L, the second high-k gate dielectric layer 48L, and the third high-k gate dielectric layer 56L is composed of a compositionally different high-k gate dielectric material. These embodiments illustrate the flexibility of the present application.

In some embodiments (applicable to both the first and second embodiments mentioned above), each logic device of the first pair of logic devices is of a different conductivity type (p-type or n-type), each logic device of the second pair of logic devices is of a different conductivity type, and each I/O device of the pair of I/O devices is of a different conductivity type. This demonstrates the flexibility of the present application.

In some embodiments (applicable to both the first and second embodiments mentioned above) each of the first high-k gate dielectric layer 40L, the second high-k gate dielectric layer 48L, and the third high-k gate dielectric layer 56L is composed of a compositionally different high-k gate dielectric material. This demonstrates the flexibility of the present application.

Referring now to FIG. 1, there is illustrated a device layout that can be employed in the present application. The device layout includes a plurality of gate structures, namely GS1, GS2 and GS3, that are oriented parallel to each other and perpendicular to an active area, AA; the illustrated device layout includes cut X-X. Cut X-X is through a lengthwise direction of the active area and the X-X cut passes through each of GS1, GS2 and GS3. The illustrated device layout further includes a first device region D1 in which a first type of stacked devices is to be subsequently formed, a second device region D2 in which a second type of stacked devices is to be subsequently formed, and a third device region D3 in which a first type of stacked devices is to be subsequently formed.

In the present application, D1 is a device region in which a first pair of logic devices having a first threshold voltage, Vt1, is formed, D2 is a device region in which a second pair of logic devices having a second threshold voltage, Vt2, is formed, wherein Vt2 is different from Vt1, and D3 is a device region in which a pair of input/output (I/O) devices is formed. Within each of D1 and D2, the pair of logic devices are stacked one on top the other, and in D3 the pair of I/O devices are stacked one on top the other. These different device regions require different gate dielectrics due to performance and reliability needs.

In the present application, logic devices and the I/O device are described and illustrated as stacked nanosheet transistors. A transistor includes a source region, a drain region, a semiconductor channel region located between the source region and the drain region, and a gate electrode located above the semiconductor channel region. A nanosheet transistor is a non-planar transistor that includes a vertical stack of spaced apart semiconductor channel material nanosheets as the semiconductor channel region with a pair of source/drain regions located at each of the ends of the vertical stack of spaced apart semiconductor channel material nanosheets. The gate structure (as referred to herein as a gate region) including a gate dielectric and a gate electrode wraps around each of the spaced apart semiconductor channel material nanosheets. A stacked nanosheet transistor is a transistor including a first vertical stack of spaced apart first semiconductor channel material nanosheets and a second vertical stack of spaced apart second semiconductor channel material nanosheets stacked above the first vertical stack. Although stacked nanosheet transistors are described and illustrated, the present application can be used with stacked planar transistors, or other non-planar transistors such as, for example, stacked semiconductor nanowire transistors or stacked finFET transistors. Any combination of these types of stacked devices can be used.

Figure 2A:
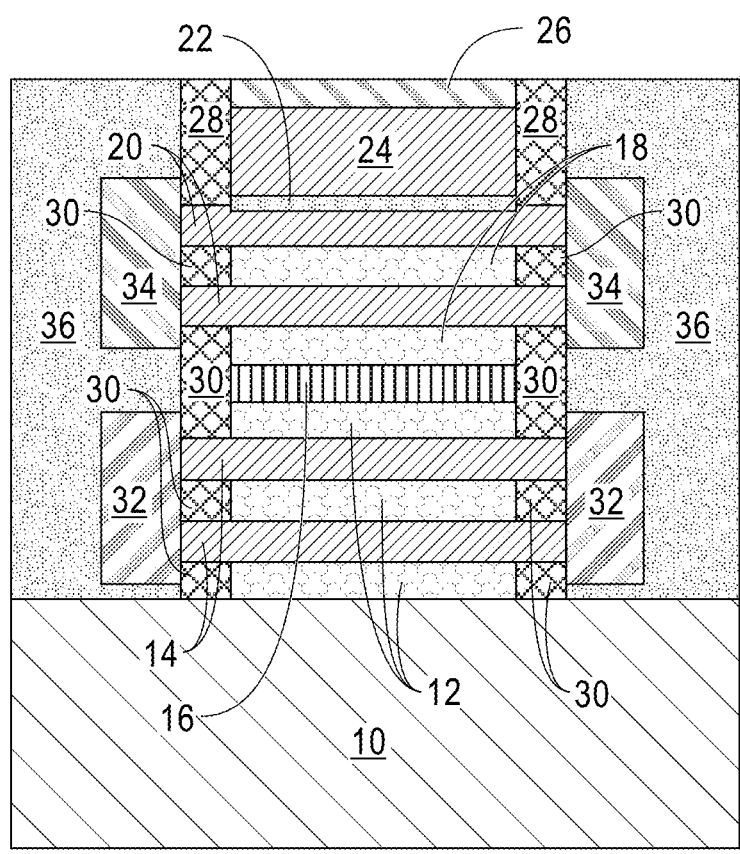
FIGS. 2A, 2B and 2C are cross sectional views of different device regions, namely first device region D1 (illustrated in FIG. 2A), second device region D2 (illustrated in FIG. 2B), and third device region D3 (illustrated in FIG. 2C) of an exemplary semiconductor structure that can be employed in the present application, the exemplary structure in each of D1, D2 and D3 includes a second nanosheet material stack located over a first nanosheet material stack, and a sacrificial gate structure located on the stacked first and second nanosheet material stacks, each first nanosheet material stack includes alternating first sacrificial semiconductor material nanosheets and first semiconductor channel material nanosheets, and each second nanosheet material stack includes alternating second sacrificial semiconductor material nanosheets and second semiconductor channel material nanosheets.
Figure 2C:
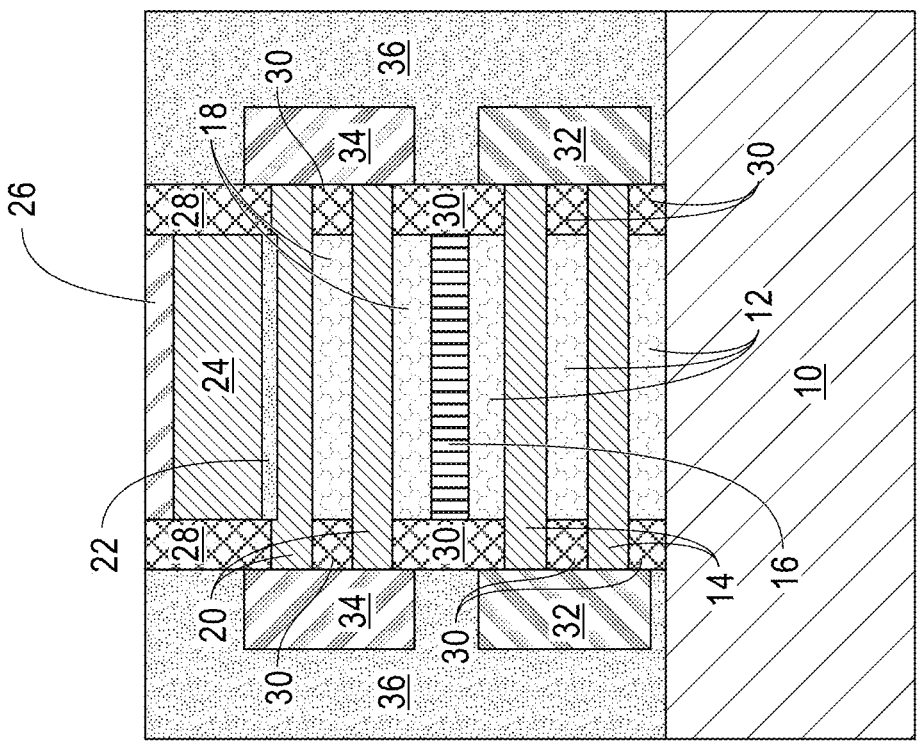
Figure 2B:
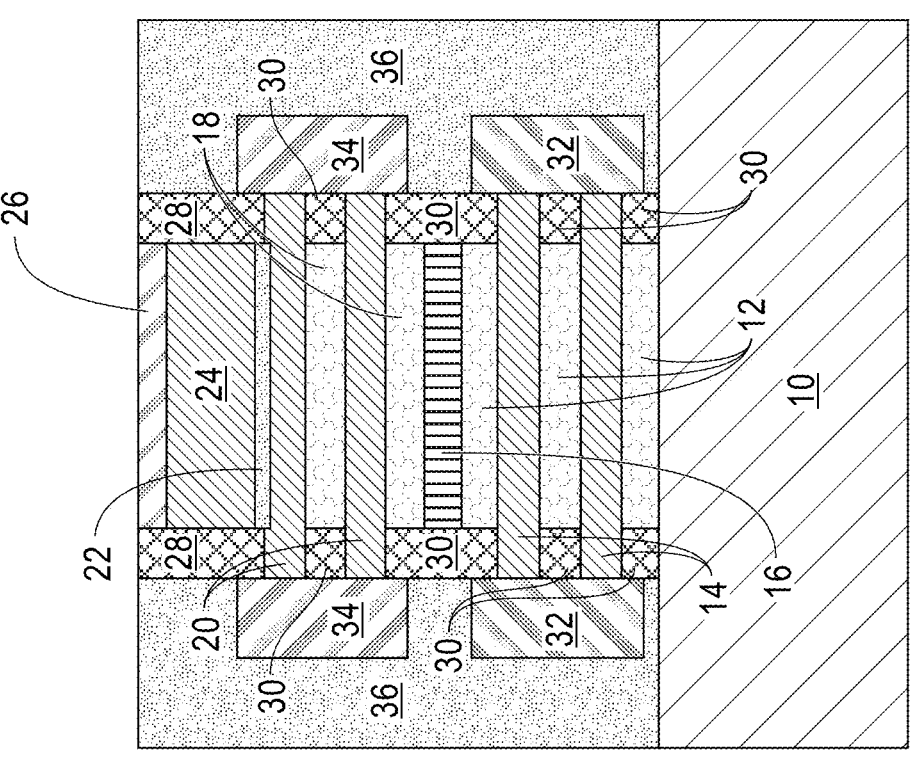

Referring now to FIGS. 2A, 2B and 2C, there are illustrated an exemplary semiconductor structure that can be employed in the present application. The exemplary semiconductor structure is present in each of D1, D2 and D3. Although the device regions, D1, D2 and D3 are drawn in separate figures, D1, D2 and D3 would be present adjacent to each other (in any order) and on a same semiconductor substrate 10. Within each of D1, D2 and D3, the exemplary semiconductor structure includes a second nanosheet material stack located over a first nanosheet material stack. Each first nanosheet material stack includes alternating first sacrificial semiconductor material nanosheets 12 and first semiconductor channel material nanosheets 14. Each second nanosheet material stack includes alternating second sacrificial semiconductor material nanosheets 18 and second semiconductor channel material nanosheets 20. As is illustrated, a middle dielectric isolation layer 16 separates the first nanosheet material stack from the second nanosheet material stack.

The illustrated exemplary structure further incudes a sacrificial gate structure located on each of the stacked first and second nanosheet material stacks. Each sacrificial gate structure can include a sacrificial gate dielectric layer 22 and a sacrificial gate layer 24. In some embodiments, the sacrificial gate dielectric layer 22 is optional.

In some embodiments and as is illustrated in FIGS. 2A-2C, a sacrificial gate cap 26 can be located on each of the sacrificial gate structures. In other embodiments, the sacrificial gate cap 26 can be omitted. When present, the sacrificial gate cap 26 is present on a topmost surface of the sacrificial gate layer 24.

Within each of D1, D2 and D3, the exemplary semiconductor structure can also include a gate spacer 28, an inner spacer 30, a first source/drain region 32, a second source/drain region 34 and an interlayer dielectric (ILD) layer 36. The gate spacer 28 is present located along a sidewall of the sacrificial gate structure and, if present, the sacrificial gate cap 26. The inner spacer 30 is located at the ends of each second sacrificial semiconductor material nanosheets 18, the ends of the middle dielectric isolation layer 16 and the end of each of the first sacrificial semiconductor material nanosheets 12. The first source/drain region 32 extends from each sidewall of each first semiconductor channel material nanosheet 14. The second source/drain region 34 extends from each sidewall of each second semiconductor channel material nanosheet 20. The first source/drain region 32 is spaced apart from the second source/drain region 34 by a dielectric material (in the illustrated embodiment, the dielectric material is shown as a portion of the ILD layer 36). The ILD layer 36 embeds the first source/drain regions 32 and the second source/drain region 34.

The semiconductor substrate 10 includes at least one semiconductor material. The term "semiconductor material" is used throughout the present application to denote a material having semiconducting properties. Examples of semiconductor materials that can be used in the present application in providing the first semiconductor material and the second semiconductor material include, but are not limited to, silicon (Si), a silicon germanium (SiGe) alloy, a silicon germanium carbide (SiGeC) alloy, germanium (Ge), III/V compound semiconductors or II/VI compound semiconductors. In some embodiments, semiconductor substrate 10 is a bulk semiconductor substrate including a single semiconductor material, e.g., Si. In another embodiment, the semiconductor substrate 10 is composed of multiples semiconductor material layers, e.g., Si/SiGe. In yet other embodiments, the semiconductor substrate 10 is a semiconductor-on-insulator (SOI) substrate that includes a material stack of, and from bottom to top, a lower semiconductor layer, a buried dielectric layer (silicon dioxide and/or boron nitride), and an upper semiconductor layer. One example of an SOI substrate is one including Si/silicon dioxide/Si.

As mentioned above, each first nanosheet material stack includes alternating first sacrificial semiconductor material nanosheets 12 and first semiconductor channel material nanosheets 14.

In some embodiments and as is illustrated in FIGS. 2A-2C, each first semiconductor channel material nanosheet 14 is sandwiched between a lower first sacrificial semiconductor material nanosheet and an upper first sacrificial semiconductor material nanosheet. In such embodiments, there is "n+1" number of first sacrificial semiconductor material nanosheets 12 and "n" number of first semiconductor channel material nanosheets 14 with each first nanosheet material stack, wherein n is an integer starting from one. By way of one example, each first nanosheet material stack includes three first sacrificial semiconductor material nanosheets 12 and two first semiconductor channel material nanosheets 14.

Each first sacrificial semiconductor material nanosheet 12 is composed of a first semiconductor material, while each first semiconductor channel material nanosheet 14 is composed of a second semiconductor material that is compositionally different from the first semiconductor material. In some embodiments, the second semiconductor material that provides each first semiconductor channel material nanosheet 14 can provide high channel mobility for n-type field effect transistor (FET) devices. In other embodiments, the second semiconductor material that provides each first semiconductor channel material nanosheet 14 can provide high channel mobility for p-type FET devices. The first semiconductor material that provides each first sacrificial semiconductor material nanosheet 12, and the second semiconductor material that provides each first semiconductor channel material nanosheet 14 can include one of the semiconductor materials mentioned above for semiconductor substrate 10. In one example, each first sacrificial semiconductor material nanosheet 12 is composed of a silicon germanium alloy having a germanium content from 20 atomic percent to 40 atomic percent, and each first semiconductor channel material nanosheet 14 is composed of silicon.

Each first sacrificial semiconductor material nanosheet 12 can have a first thickness, and each first semiconductor channel material nanosheet 14 can have a second thickness. In the present application, the first thickness can be equal to, greater than, or less than, the second thickness. As is illustrated in FIGS. 2A-2C, each first sacrificial semiconductor material nanosheet 12 has a reduced length as compared to the length of each first semiconductor channel material nanosheet 14.

As mentioned above, each second nanosheet material stack includes alternating second sacrificial semiconductor material nanosheets 18 and second semiconductor channel material nanosheets 20. In some embodiments and as is illustrated in FIGS. 2A-2C, there is an equal number of second semiconductor channel material nanosheets 20 and second sacrificial semiconductor material nanosheets 18. In such embodiments, there is "x" number of second sacrificial semiconductor material nanosheets 18 and "x" number of second semiconductor channel material nanosheets 20 with each first nanosheet material stack, wherein x is an integer starting from one. By way of one example, each second nanosheet material stack includes two second sacrificial semiconductor material nanosheets 18 and two second semiconductor channel material nanosheets 20.

Each second sacrificial semiconductor material nanosheet 18 is composed of a third semiconductor material, while each second semiconductor channel material nanosheet 20 is composed of a fourth semiconductor material that is compositionally different from the third semiconductor material. In the present application, the third semiconductor material that provides each second sacrificial semiconductor material nanosheet 18 is typically compositionally the same as the first semiconductor material that provides each first sacrificial semiconductor material nanosheet 12. In the present application, the fourth semiconductor material that provides each second semiconductor channel material nanosheet 20 can be compositionally the same as, or compositionally different from, the second semiconductor material that provides each first semiconductor channel material nanosheet 14. In some embodiments, the second semiconductor material that provides each first semiconductor channel material nanosheet 14 can provide high channel mobility for n-type field effect transistor (FET) devices, while the fourth semiconductor material that provides each second semiconductor channel material nanosheet 20 can provide high channel mobility for p-type FET devices. In some embodiments, the fourth semiconductor material that provides each second semiconductor channel material nanosheet 20 can provide high channel mobility for n-type field effect transistor (FET) devices, while the second semiconductor material that provides each first semiconductor channel material nanosheet 14 can provide high channel mobility for p-type FET devices. The third semiconductor material and the fourth semiconductor material can include one of the semiconductor materials mentioned above for semiconductor substrate 10. In one exemplary embodiment, each first sacrificial semiconductor material nanosheet 12 and each second sacrificial semiconductor material nanosheet 18 are composed of a silicon germanium alloy having a germanium content from 20 atomic percent to 40 atomic percent, each first semiconductor channel material nanosheet 14 is composed of silicon, and each second semiconductor channel material nanosheet 20 is composed of Ge.

Each second sacrificial semiconductor material nanosheet 18 can have a third thickness, and each second semiconductor channel material nanosheet 20 can have a fourth thickness. In the present application, the third thickness can be equal to, greater than, or less than, the fourth thickness. As is illustrated in FIGS. 2A-2C, each second sacrificial semiconductor material nanosheet 18 has a reduced length as compared to the length of each second semiconductor channel material nanosheet 20.

The middle dielectric isolation layer 16, the gate spacer 28 and the inner spacer 30 can be composed of a dielectric spacer material including, but not limited to, silicon dioxide, SiN, SiBCN, SiOCN or SiOC. The middle dielectric isolation layer 16 and the gate spacer 28 are typically composed of a compositionally same dielectric spacer material since both the middle dielectric isolation layer 16 and gate spacer 28 are usually formed at the same time. The inner spacer 30 can be compositionally the same as, or compositionally different from, the middle dielectric isolation layer 16 and the gate spacer 28.

The optional sacrificial gate dielectric layer 22 of the sacrificial gate structure includes a sacrificial gate dielectric material such as, for example, silicon dioxide. The sacrificial gate layer 24 of the sacrificial gate structure a sacrificial gate material such as, for example, polysilicon, amorphous silicon, amorphous silicon germanium or amorphous germanium.

The sacrificial gate cap 26 that is located on the sacrificial gate layer 24 is composed of a hard mask material such as, for example, silicon nitride. Again, and in some embodiments, the sacrificial gate cap 26 can be omitted from on top of the sacrificial gate structure.

Each first source/drain region 32 is composed of a fifth semiconductor material and a first dopant. Each second source/drain region 34 is composed of a sixth semiconductor material and a second dopant. As used herein, a "source/drain" region can be a source region or a drain region depending on subsequent wiring and application of voltages during operation of the transistor. The first semiconductor and the sixth semiconductor material can be a compositionally same, or compositionally different, semiconductor material. In the present application, the fifth semiconductor material that provides each first source/drain region 32 can be compositionally the same as, or compositionally different from, the second semiconductor material that provides each first semiconductor channel material nanosheet 14. In the present application, the sixth semiconductor material that provides each second source/drain region 34 can be compositionally the same as, or compositionally different from, the fourth semiconductor material that provides each second semiconductor channel material nanosheet 20. The first dopant that is present in each first source/drain region 32 and the second dopant that is present in each second source/drain region 34 can be either a p-type dopant or an n-type dopant. In some embodiments, the first dopant is of a same conductivity type as the second dopant. In other embodiments, the first dopant is of a different conductivity type. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each of the first and second source/drain regions 32, 34 can have a dopant concentration of from $4 \times 10^{20}$ atoms/cm$^3$ to $3 \times 10^{21}$ atoms/cm$^3$.

The first and second source/drain regions 32, 34 are typically formed by an epitaxial growth process. Throughout the present application, the terms "epitaxial growth" or "epitaxially growing" mean the growth of a semiconductor material on a growth surface of another semiconductor material, in which the semiconductor material being grown has the same crystalline characteristics as the growth surface of the another semiconductor material. In an epitaxial deposition process, the chemical reactants provided by the source gases are controlled and the system parameters are set so that the depositing atoms arrive at the growth surface of the another semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

The ILD layer 36 is composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a material that has a dielectric constant of less than 4.0 (all dielectric constants mentioned herein are relative to a vacuum unless otherwise noted).

The semiconductor structure shown in FIGS. 2A-2C can be formed utilizing conventional stacked nanosheet device processing which includes various deposition steps, patterning steps and planarization steps. The various deposition steps can include chemical vapor deposition (CVD), plasma enhanced chemical vapor deposition (PECVD), physical vapor deposition (PVD), atomic layer deposition (ALD), epitaxial deposition as defined above, and/or spin-on coating. The patterning steps can include lithography and etching. The etching can include a dry etching process (such as, for example reactive etching (RIE), ion beam etching (IBE) or plasma etching) and/or a chemical wet etching process. The planarization can include chemical mechanical polishing (CMP) and/or grinding. So as not to obscure the method of the present application the processing details used in forming the exemplary structure shown in FIGS. 2A-2C are omitted.

Figure 3A:
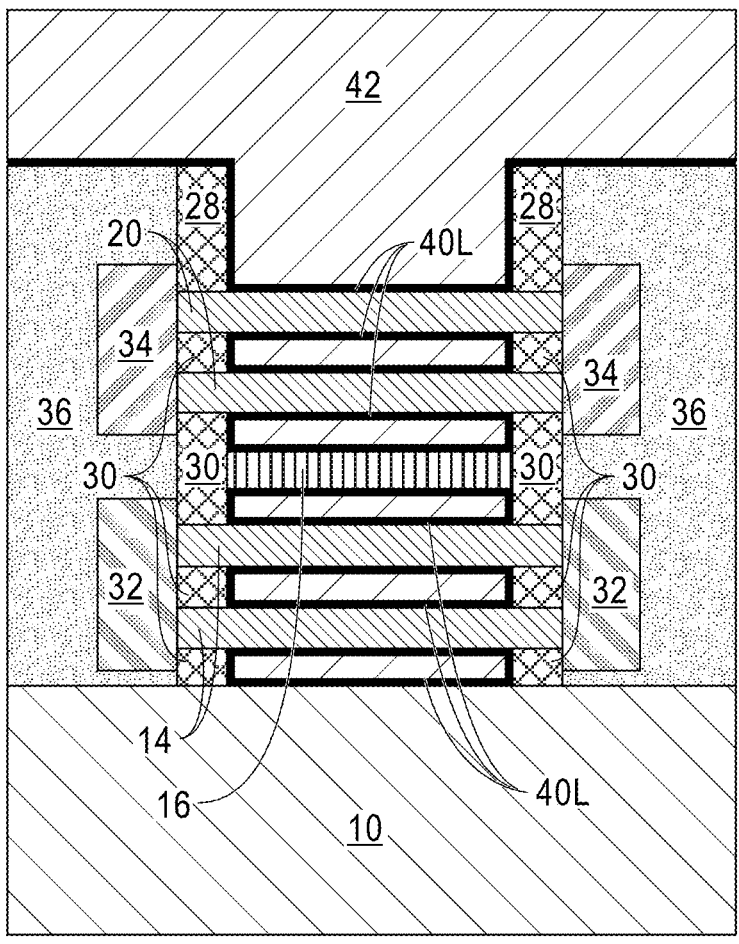
FIGS. 3A, 3B and 3C are cross sectional views of the exemplary semiconductor structure illustrated in FIGS. 2A, 2B and 2C, respectively, after forming a first block mask in D2 and D3, and nanosheet device processing in D1, the nanosheet device processing in D1 includes revealing the stacked first and second nanosheet material stacks, removing each second sacrificial semiconductor material nanosheet and each first sacrificial semiconductor material nanosheet, forming a first high-k gate dielectric layer, and forming a first gate replacement layer.
Figures 3B, 3C:
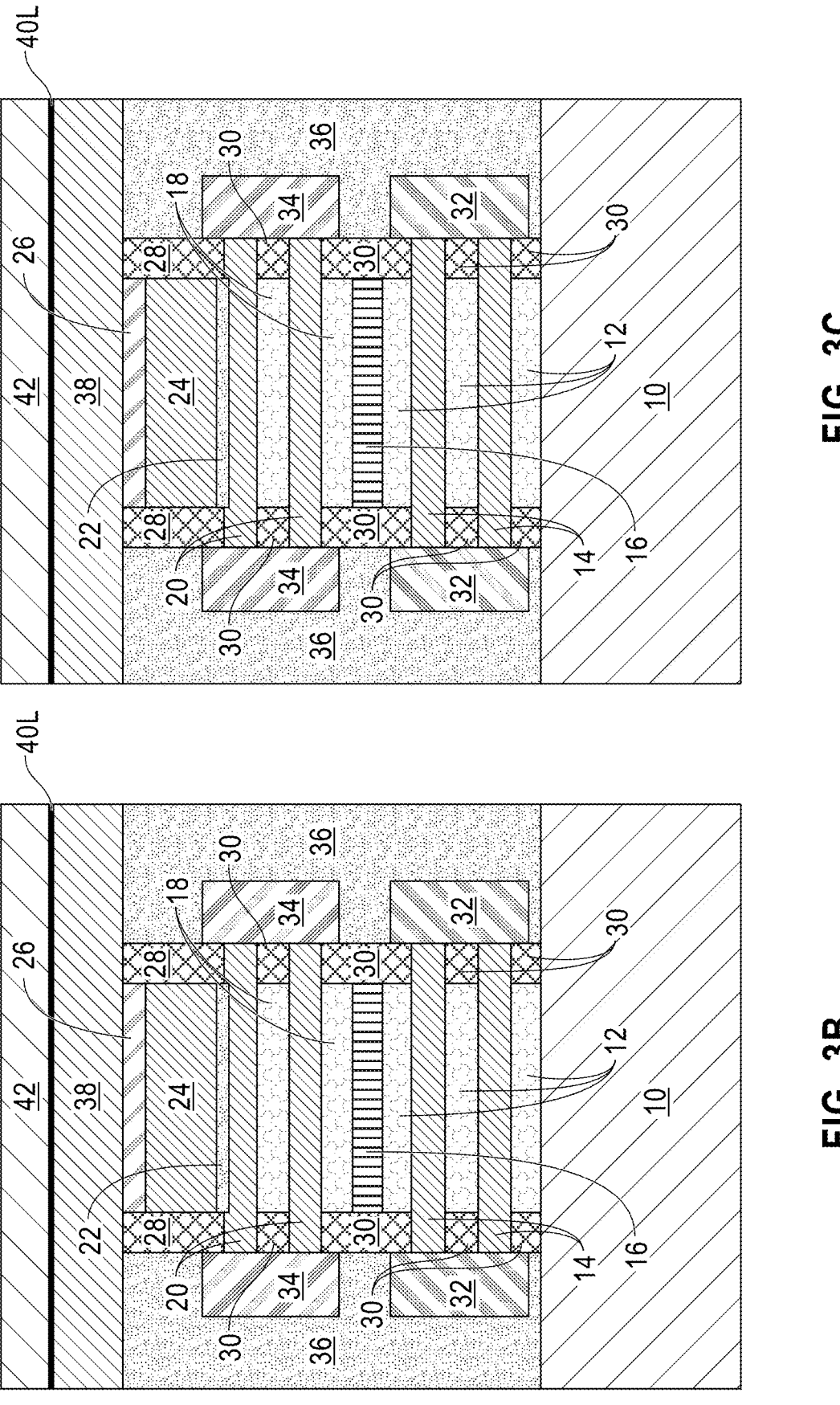

Referring now to FIGS. 3A, 3B and 3C, there are illustrated the exemplary semiconductor structure illustrated in FIGS. 2A, 2B and 2C, respectively, after forming a first block mask 38 in D2 and D3, and nanosheet device processing in D1, the nanosheet device processing in D1 includes revealing the stacked first and second nanosheet material stacks, removing each second sacrificial semiconductor material nanosheet 18 and each first sacrificial semiconductor material nanosheet 12, forming a first high-k gate dielectric layer 40L, and forming a first gate replacement layer 42. First block mask 38 is composed of any block mask material including, for example, an organic planarization layer (OPL). First block mask 38 can be formed by depositing a blanket layer of the block mask material in each of D1, D2 and D3. The depositing of the blanket layer of block mask material can include, but is not limited to, CVD, PECVD, or PVD. The blanket layer of block mask material is then removed from D1 by lithography and etching; the block mask material is maintained in D2 and D3. The retained block mask material in D2 and D3 is the first block mask 38. In one example, the etch includes RIE.

The first block mask 38 is used to protect D2 and D3 during the nanosheet device processing in D1. The nanosheet device processing in D1 includes first revealing the stacked first and second nanosheet material stacks present in D1. The revealing of the stacked first and second nanosheet material stacks present in D1 includes removing the sacrificial gate cap 26, if the same is present, and the sacrificial gate structure (including the optional sacrificial gate dielectric layer 22 and the sacrificial gate layer 24). The removal process includes one or more etching processes. The one or more etching processes can include RIE.

The removal of each second sacrificial semiconductor material nanosheet 18 and each first sacrificial semiconductor material nanosheet 12 from D1 includes any material removal process (such as, for example, etching) or combination of removal process (combination of two etching processes) which is (are) selective in removing the first sacrificial semiconductor material nanosheets 12 and the second sacrificial semiconductor material nanosheets 18. This removal step suspends a portion of each first semiconductor channel material nanosheet 14 and each second semiconductor channel material nanosheet 20 that are present in D1.

Figure 13A:
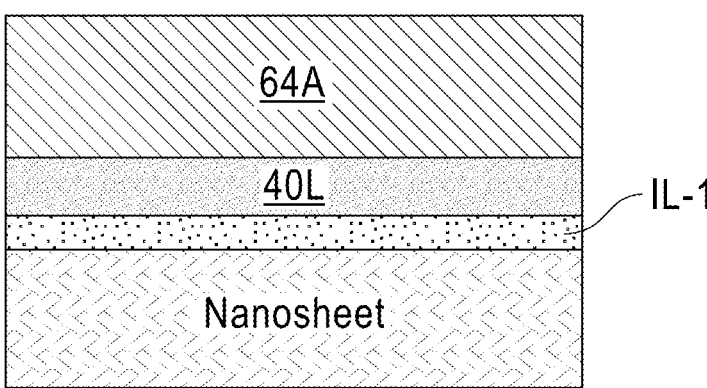
FIGS. 13A, 13B and 13C are cross sectional views representing a portion of the gate region that is present in each of D1, D2 and D3.

Prior to forming the first high-k gate dielectric layer 40L, a first interfacial dielectric layer (not specifically shown for clarity in FIG. 3A but see FIG. 13A) is formed around each of the first semiconductor channel material nanosheets 14 and the second semiconductor channel material nanosheets 20 and on a topmost surface of the semiconductor substrate 10 in D1. The first interfacial dielectric layer in D1 would be configured in the same way as the third interfacial dielectric layer 55 shown in D3 (see, for example, FIG. 12C). The first interfacial dielectric layer is composed of at least one semiconductor oxide such as, for example, silicon oxide. The semiconductor oxide of the first interfacial dielectric layer would match the semiconductor material that is formed thereon. The first interfacial dielectric layer in D1 has a first thickness. The first interfacial dielectric layer can be formed by a thermal oxidation process. In FIG. 13A, the first interfacial layer, IL-1, is shown.

The first high-k gate dielectric layer 40L is then formed in each of D1, D2 and D3. In D1, the first high-k gate dielectric layer 40L is formed on and around the first interfacial dielectric layer that is located on each suspended first and second semiconductor channel material nanosheets 14, 20 and on the middle dielectric isolation layer 16. In D1, the first high-k gate dielectric layer 40L is also formed along an inner sidewall of the inner spacer 30 and along a topmost surface of semiconductor substrate 10 as well as atop the gate spacer 28 and ILD layer 36. In D2 and D3, the first high-k gate dielectric layer 40L is formed on top of the first block mask 38.

The first high-k gate dielectric layer 40L is a first high-k gate dielectric material. The high-k gate dielectric material has a dielectric constant of greater than 4.0. Illustrative examples of first high-k gate dielectric materials include, but are not limited to, hafnium dioxide ($HfO_2$), hafnium silicon oxide (HfSiO), hafnium silicon oxynitride (HfSiO), lanthanum oxide ($La_2O_3$), lanthanum aluminum oxide ($LaA_1O_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide (Pb$(Sc,Ta)O_3$), and/or lead zinc niobite (Pb(Zn,Nb)O). The first high-k gate dielectric material can further include dopants such as lanthanum (La), aluminum (Al) and/or magnesium (Mg).

The first high-k gate dielectric layer 40L can be formed by a deposition process including, but not limited to, CVD, PECVD or ALD. The first high-k gate dielectric layer 40L can have a first high-k gate dielectric thickness.

The first gate replacement layer 42 is then formed in each of D1, D2 and D3. In each of D1, D2 and D3, the first gate replacement layer 42 is formed on a surface of the first high-k gate dielectric layer 40L. Note that within D1, the first gate replacement layer 42 fills in the gap between each suspended first and second semiconductor channel material nanosheets 14, 20, and between the suspended middle dielectric isolation layer 16. The first gate replacement layer 42 can include one of the sacrificial gate materials mentioned above for the sacrificial gate layer 24 of the sacrificial gate structure. The first gate replacement layer 42 can be formed by a deposition process including, but not limited to, CVD, PECVD or ALD.

Figure 4A:
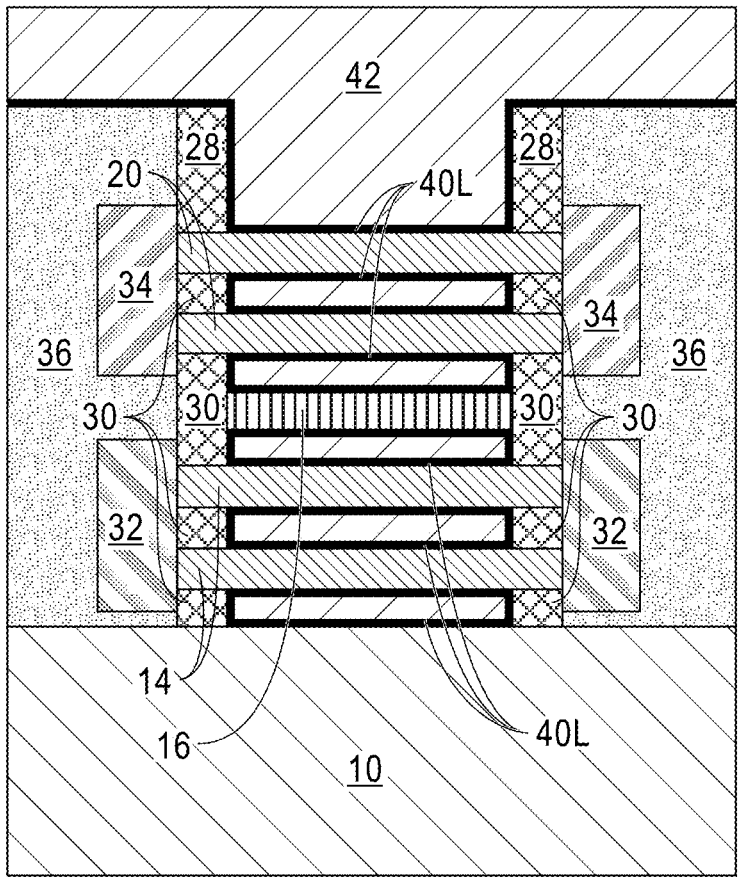
FIGS. 4A, 4B and 4C are cross sectional views of the exemplary semiconductor structure illustrated in FIGS. 3A, 3B and 3C, respectively, after performing a first planarization process in D1, D2 and D3 to remove the first gate replacement layer and the first high-k gate dielectric layer from D2 and D3.
Figure 4C:
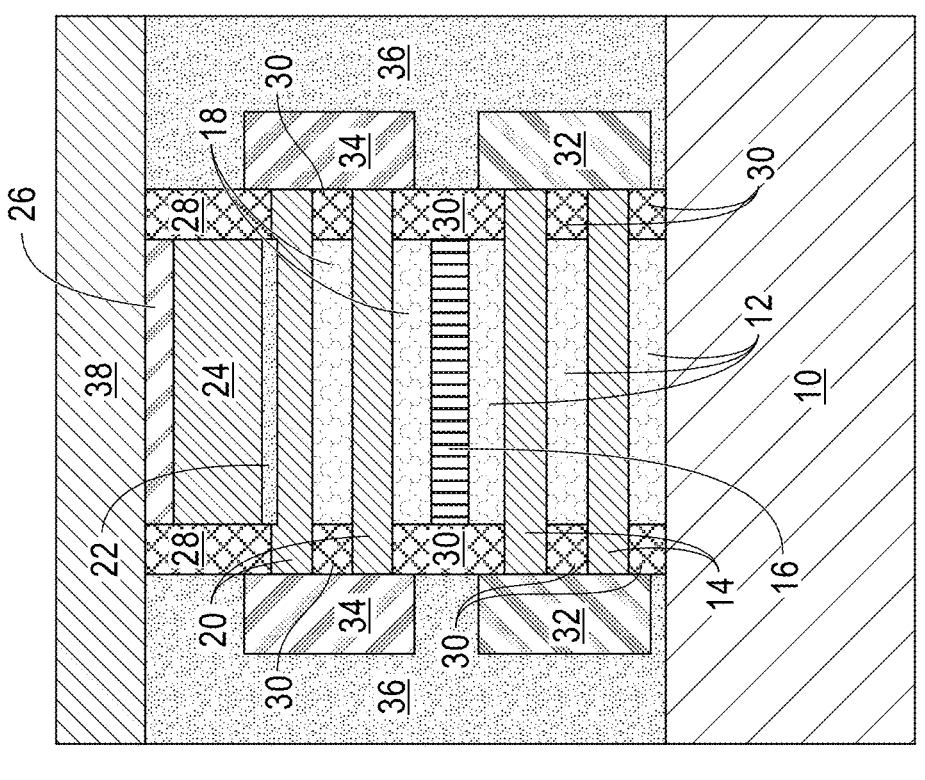
Figure 4B:
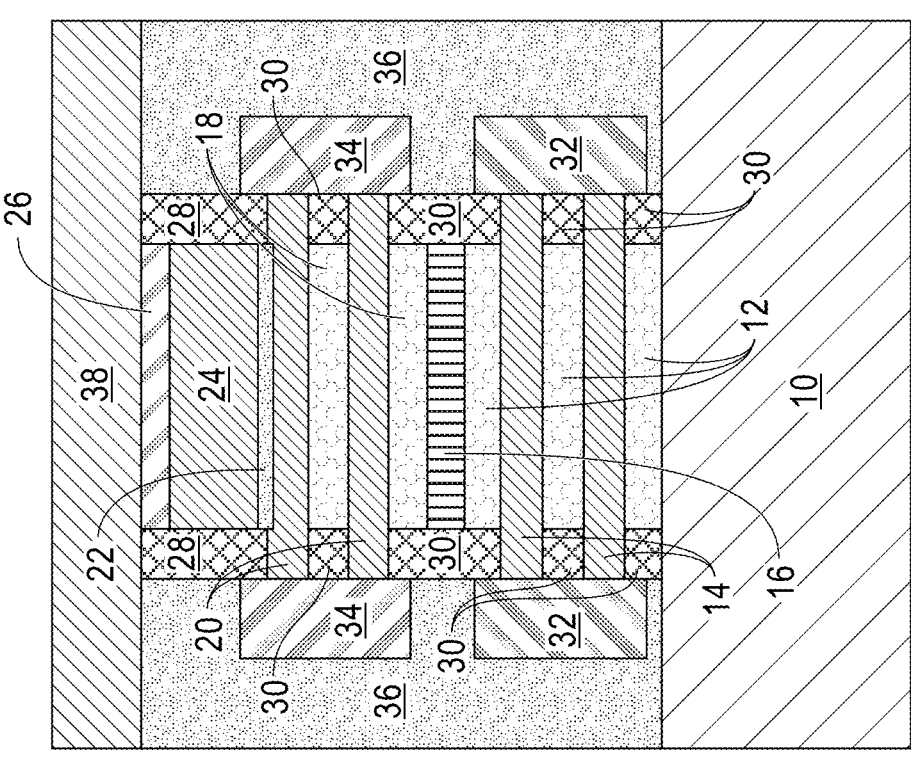

Referring now to FIGS. 4A, 4B and 4C, there are illustrated the exemplary semiconductor structure illustrated in FIGS. 3A, 3B and 3C, respectively, after performing a first planarization process in D1, D2 and D3 to remove the first gate replacement layer 42 and the first high-k gate dielectric layer 40L from D2 and D3. This first planarization process can also remove an upper portion of the first gate replacement layer 42 from D1. The first planarization process can include CMP or grinding. Within D2 and D3, the first planarization process reveals the first block mask 38.

Figure 5A:
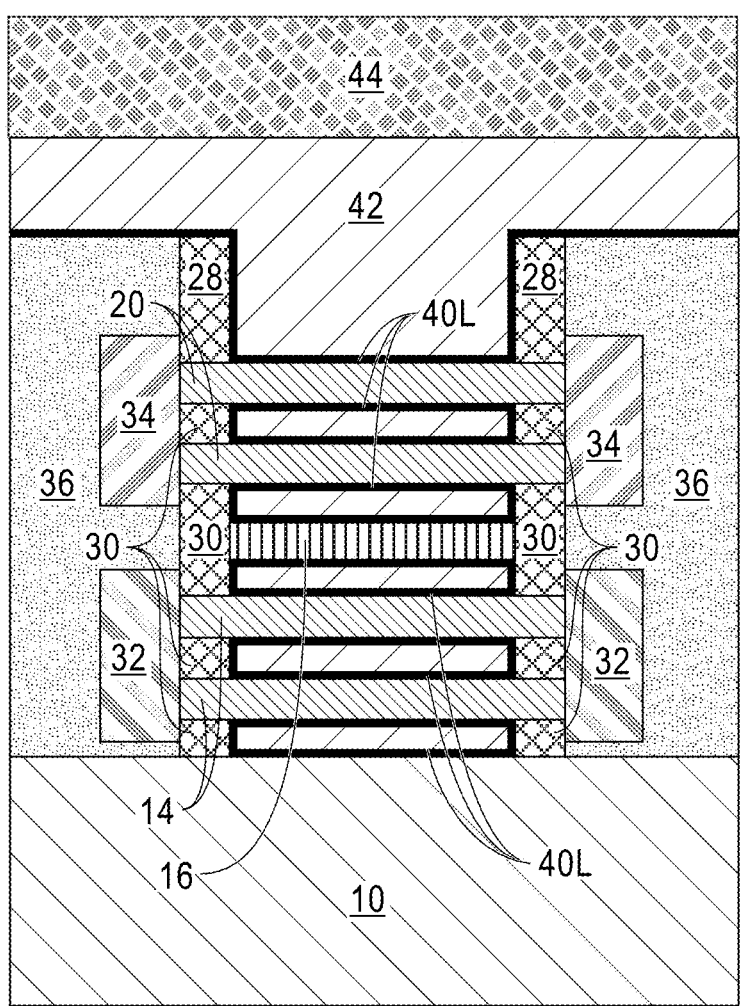
FIGS. 5A, 5B and 5C are cross sectional views of the exemplary semiconductor structure illustrated in FIGS. 4A, 4B and 4C, respectively, after forming a second block mask in D1 and D3, removing the first block mask from D2 and nanosheet device processing in D2, the nanosheet device processing in D2 includes revealing the stacked first and second nanosheet material stacks, and removing each second sacrificial semiconductor material nanosheet and each first sacrificial semiconductor material nanosheet to form an opening in D2.
Figure 5C:
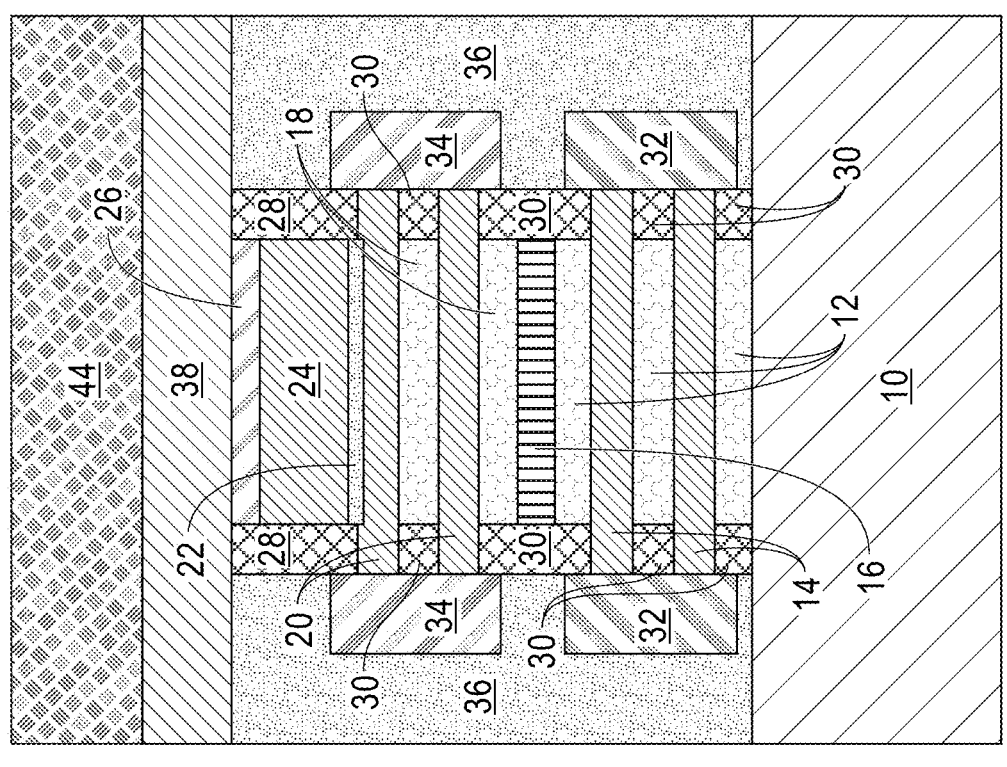
Figure 5B:
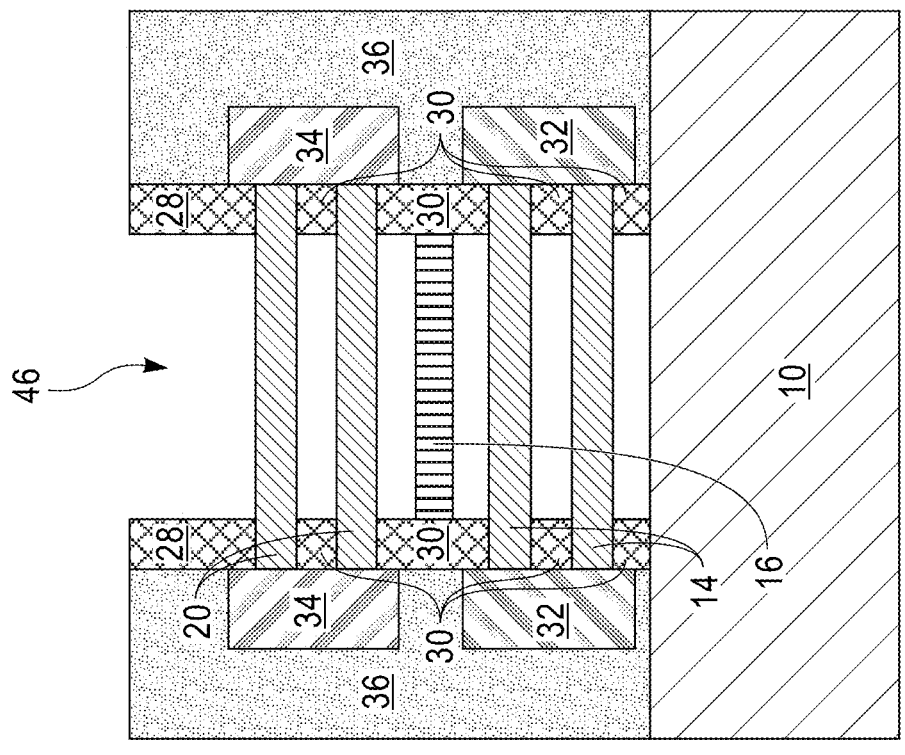

Referring now to FIGS. 5A, 5B and 5C, there are illustrated the exemplary semiconductor structure illustrated in FIGS. 4A, 4B and 4C, respectively, after forming a second block mask 44 in D1 and D3, removing the first block mask 38 from D2 and nanosheet device processing in D2, the nanosheet device processing in D2 includes revealing the stacked first and second nanosheet material stacks in D2, and removing each second sacrificial semiconductor material nanosheet 18 and each first sacrificial semiconductor material nanosheet 12 to form an opening 46 in D2.

Second block mask 44 includes one of the block mask materials mentioned above for the first block mask 38. The block mask material that provides the second block mask 44 can be compositionally the same as, or compositionally different from, the block mask material that provides the first block mask 38. Second block mask 44 can be formed utilizing the same technique as mentioned above in forming the first block mask 38. Within D1, the second block mask 44 is formed on the first gate replacement layer 42. Within D3, the second block mask 44 is formed on the first block mask 38.

The first block mask 38 is removed from D2 utilizing an etching process that is selective in removing the first block mask 38 from D2. In some embodiments, the removal of the first block mask 38 from D2 occurs simultaneously with the removing of the blanket layer of hard mask material from D2 that provides the second block mask 44. In other embodiments, the removal of the first block mask 38 from D2 occurs utilizing a different material removal process, e.g., etching, then that was used to removing of the blanket layer of hard mask material from D2.

With no block masks present in D2, the nanosheet device processing in D2 includes first revealing the stacked first and second nanosheet material stacks present in D2. The revealing of the stacked first and second nanosheet material stacks present in D2 includes removing the sacrificial gate cap 26, if the same is present, and the sacrificial gate structure (including the optional sacrificial gate dielectric layer 22 and the sacrificial gate layer 24). The removal process includes one or more etching processes. The one or more etching processes can include RIE.

The removal of each second sacrificial semiconductor material nanosheet 18 and each first sacrificial semiconductor material nanosheet 12 from D2 includes any material removal process (such as, for example, etching) or combination of removal process (combination of two etching processes) which is (are) selective in removing the first sacrificial semiconductor material nanosheets 12 and the second sacrificial semiconductor material nanosheets 18. This removal step suspends a portion of each first semiconductor channel material nanosheet 14 and each second semiconductor channel material nanosheet 20 that are present in D2 and provides opening 46 in D2. Note that the middle dielectric isolation layer 16 is also suspended during this step of the present application.

Figure 6A:
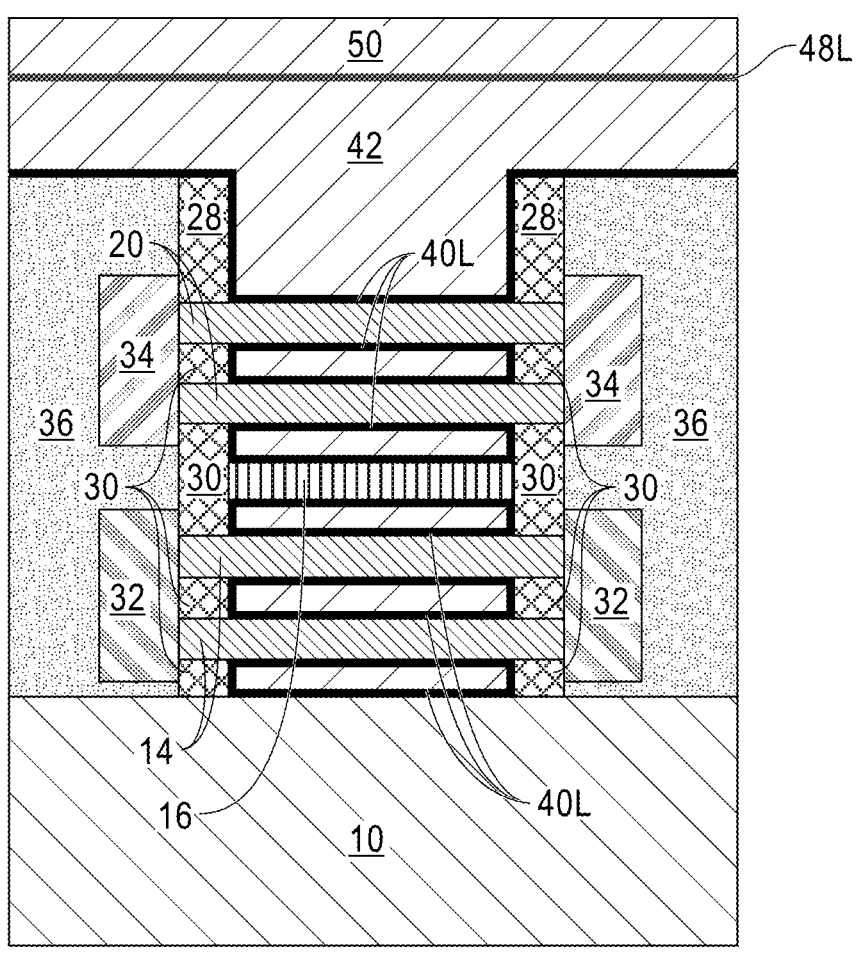
FIGS. 6A, 6B and 6C are cross sectional views of the exemplary semiconductor structure illustrated in FIGS. 5A, 5B and 5C, respectively, after removing the second block mask in D1 and D3, and further nanosheet device processing in D2, the further nanosheet device processing in D2 includes forming a second high-k gate dielectric layer and forming a second gate replacement layer.
Figure 6C:
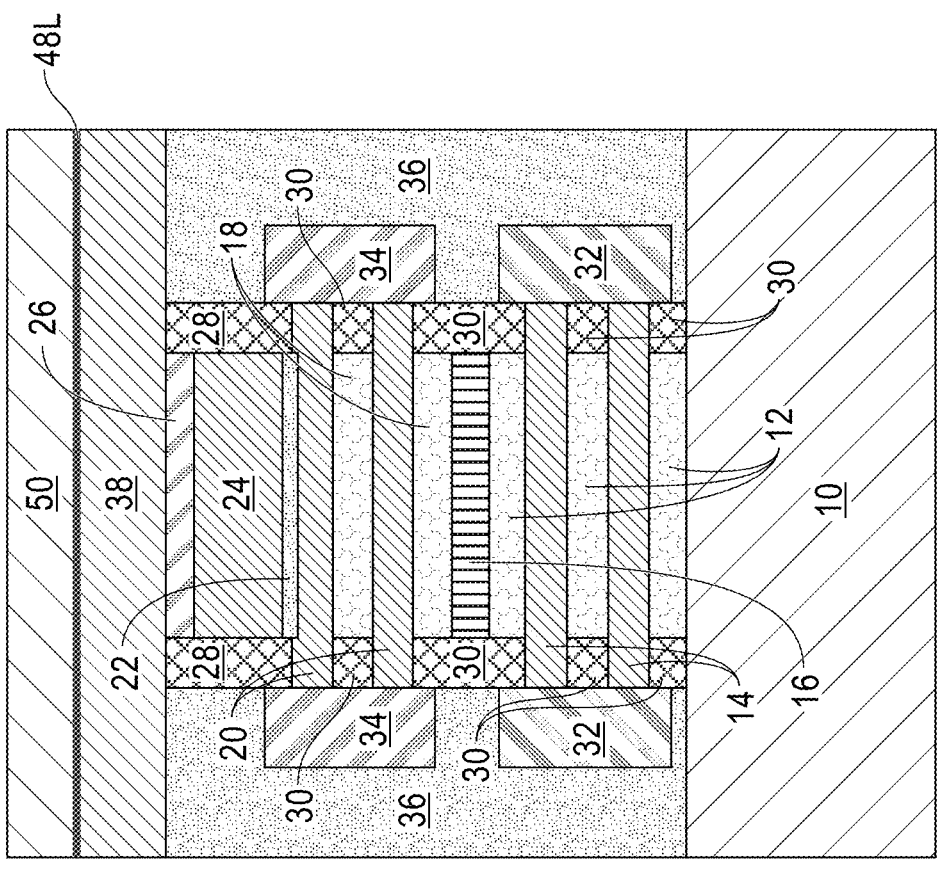
Figure 6B:
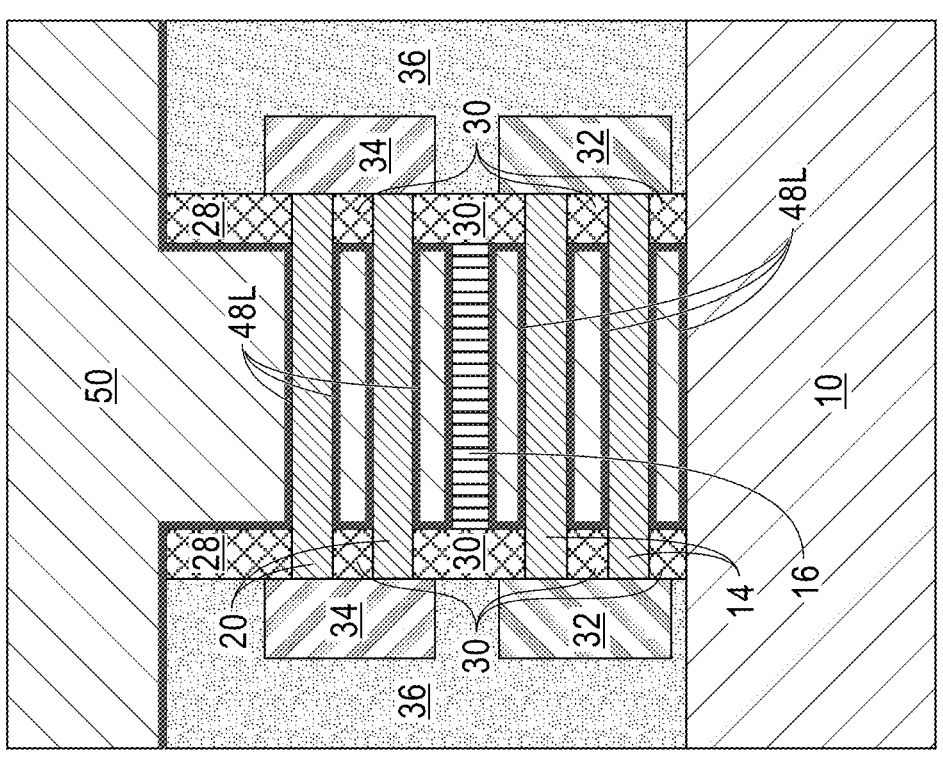

Referring now to FIGS. 6A, 6B and 6C, there are illustrated the exemplary semiconductor structure illustrated in FIGS. 5A, 5B and 5C, respectively, after removing the second block mask 44 in D1 and D3, and further nanosheet device processing in D2, the further nanosheet device processing in D2 includes forming a second high-k gate dielectric layer 48L and forming a second gate replacement layer 50. The removal of the second block mask 44 in D1 and D3 includes any material removal process that is selective in removing the second block mask 44. In D1, the removal of the second block mask 44 physically exposes the first gate replacement layer 42. In D3, the removal of the second block mask 44 physically exposes the first block mask 38.

Figure 13B:
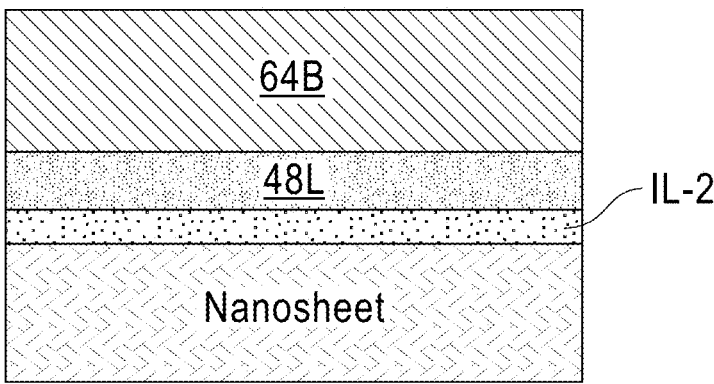

Prior to forming the second high-k gate dielectric layer 48L a second interfacial dielectric layer (not specifically shown for clarity) is formed around each of the first semiconductor channel material nanosheets 14 and the second semiconductor channel material nanosheets 20 and on a topmost surface of the semiconductor substrate 10 in D2. The second interfacial dielectric layer in D2 would be configured in the same way as the third interfacial dielectric layer 55 shown in D3 (see, for example, FIG. 12C). The second interfacial dielectric layer is composed of at least one semiconductor oxide such as, for example, silicon oxide. The semiconductor oxide of the second interfacial dielectric layer would match the semiconductor material that is formed thereon. The second interfacial dielectric layer in D2 has a second thickness. In embodiments of the present application, the second thickness of the second interfacial dielectric layer is greater than the first thickness of the first interfacial dielectric layer. The second interfacial dielectric layer can be formed by a thermal oxidation process. The second interfacial layer is shown in FIG. 13B as IL-2.

The second high-k gate dielectric layer 48L is then formed in each of D1, D2 and D3. In D1, the second high-k dielectric layer 48L is formed on the first gate replacement layer 42. In D2, the second high-k gate dielectric layer 48L is formed on the second interfacial dielectric layer that is located on and around each suspended first and second semiconductor channel material nanosheets 14, 20, and on the middle dielectric isolation layer 16 within opening 46. In D2, the second high-k gate dielectric layer 48L is also formed along an inner sidewall of the inner spacer 30 and along a topmost surface of semiconductor substrate 10 as well as atop the gate spacer 28 and ILD layer 36. In D3, the second high-k gate dielectric layer 48L is formed on top of the first block mask 38.

The second high-k gate dielectric layer 48L is a second high-k gate dielectric material. The second high-k gate dielectric material has a dielectric constant of greater than 4.0 Illustrative examples of second high-k gate dielectric materials include, but are not limited to, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite ($Pb(Zn,Nb)O$). The first high-k gate dielectric material can further include dopants such as lanthanum (La), aluminum (Al) and/or magnesium (Mg). The second high-k gate dielectric material that provides the second high-k gate dielectric layer 48L can be compositionally the same as, or compositionally different from, the first high-k gate dielectric material that provides the first high-k gate dielectric layer 40L.

The second high-k gate dielectric layer 48L can be formed by a deposition process including, but not limited to, CVD, PECVD or ALD. The second high-k gate dielectric layer 48L can have a second high-k gate dielectric thickness. The second high-k gate dielectric thickness can be equal to, less than or greater than the first high-k gate dielectric thickness.

The second gate replacement layer 50 is then formed in each of D1, D2 and D3. In each of D1, D2 and D3, the second gate replacement layer 50 is formed on a surface of the second high-k gate dielectric layer 48L. Note that within D2, the second gate replacement layer 50 fills in the gap between each suspended each suspended first and second semiconductor channel material nanosheets 14, 20, and between the suspended middle dielectric isolation layer 16. The second gate replacement layer 50 can include one of the sacrificial gate materials mentioned above for the sacrificial gate layer 24 of the sacrificial gate structure. The second gate replacement layer 50 can be compositionally the same as, or compositionally different from the first gate replacement layer 42. The second gate replacement layer 50 can be formed by a deposition process including, but not limited to, CVD, PECVD or ALD.

Figure 7A:
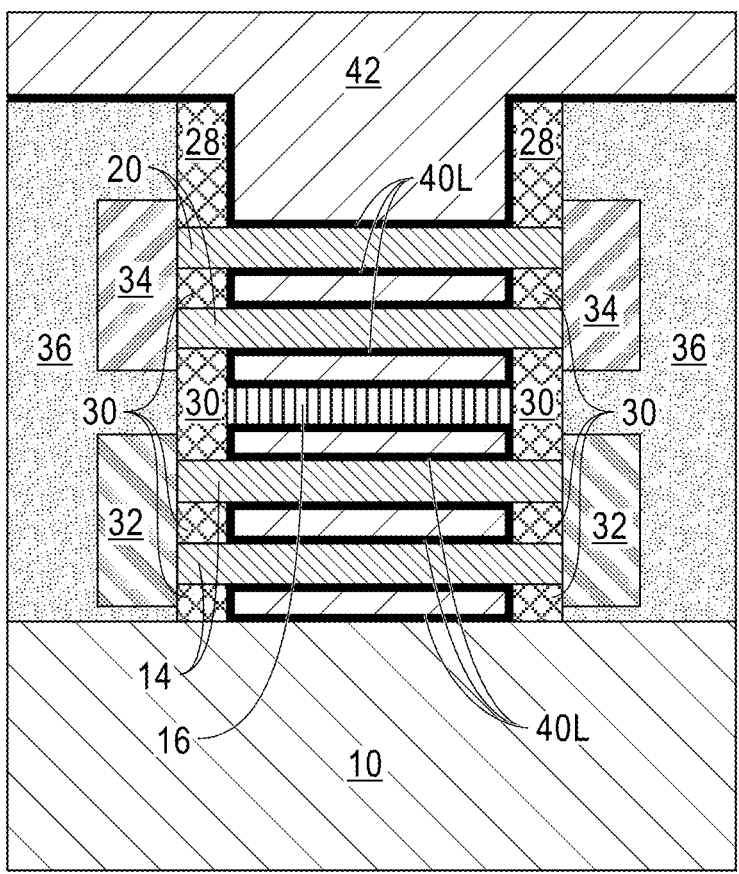
FIGS. 7A, 7B and 7C are cross sectional views of the exemplary semiconductor structure illustrated in FIGS. 6A, 6B and 6C, respectively, after performing a second planarization process in D1, D2 and D3 to remove the second gate replacement layer and the second high-k gate dielectric layer from D1 and D3.
Figure 7C:
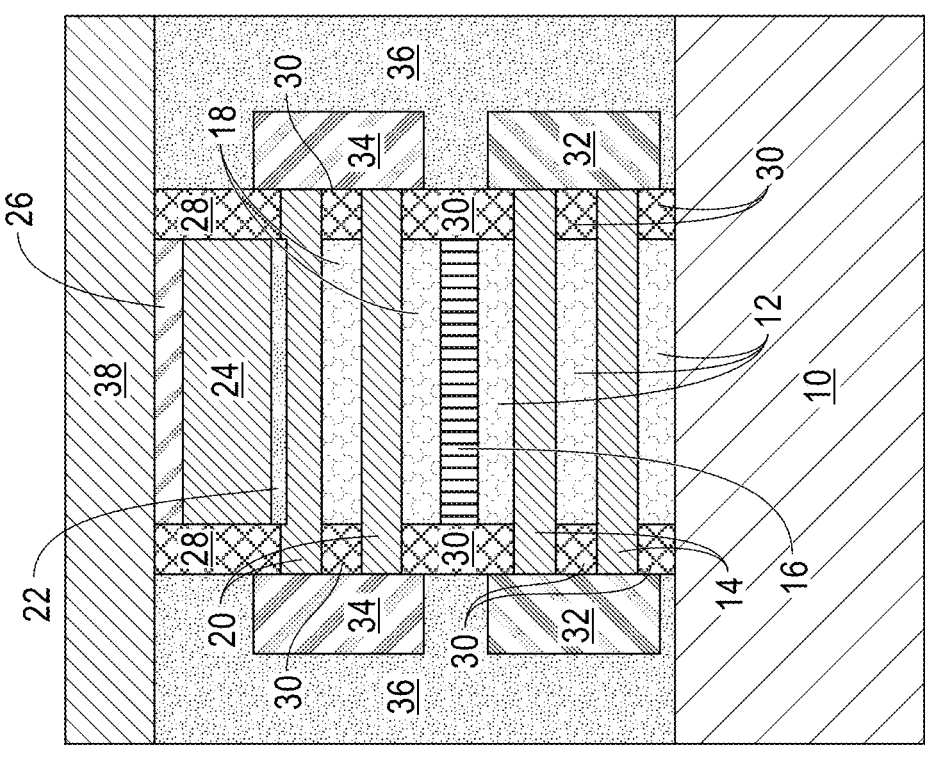
Figure 7B:
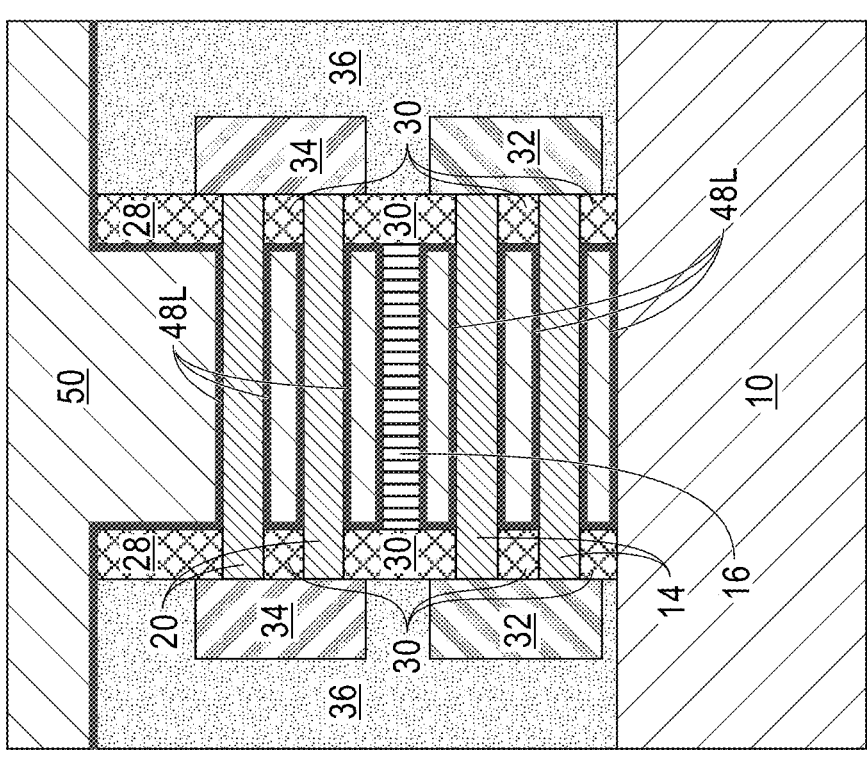

Referring now to FIGS. 7A, 7B and 7C, there are illustrated the exemplary semiconductor structure illustrated in FIGS. 6A, 6B and 6C, respectively, after performing a second planarization process in D1, D2 and D3 to remove the second gate replacement layer 50 and the second high-k gate dielectric layer 48L from D1 and D3. This second planarization process can also remove an upper portion of the second gate replacement layer 50 from D2. The second planarization process can include CMP or grinding. Within D1, the second planarization process reveals the first gate replacement layer 42. Within D3, the second planarization process reveals the first block mask 38.

Figure 8A:
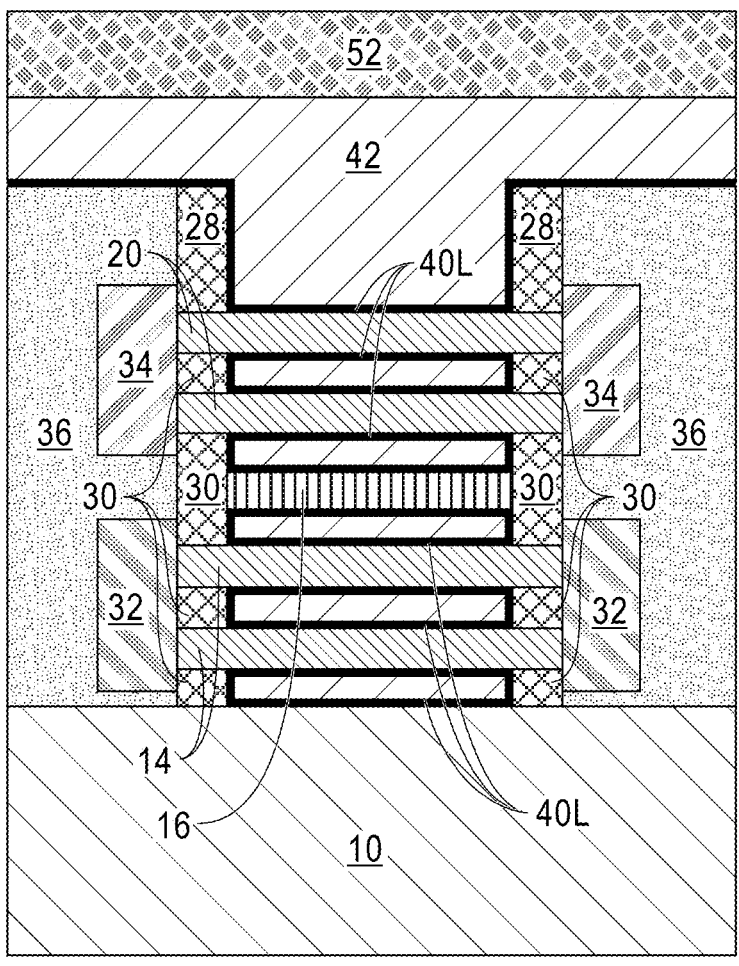
FIGS. 8A, 8B and 8C are cross sectional views of the exemplary semiconductor structure illustrated in FIGS. 7A, 7B and 7C, respectively, after forming a third block mask in D1 and D2.
Figure 8C:
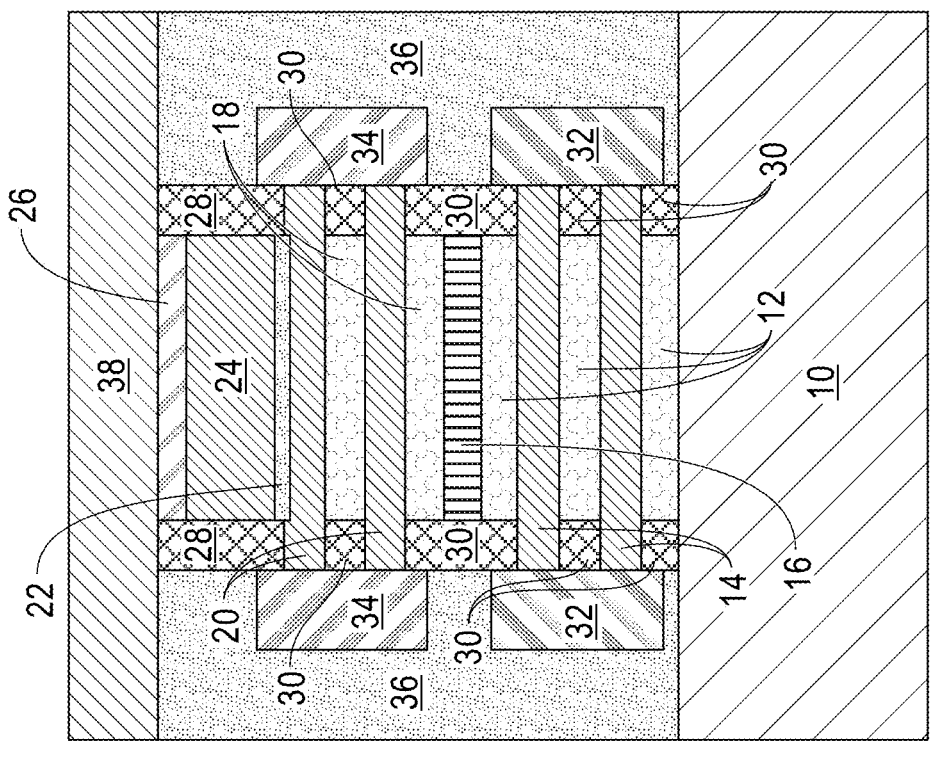
Figure 8B:
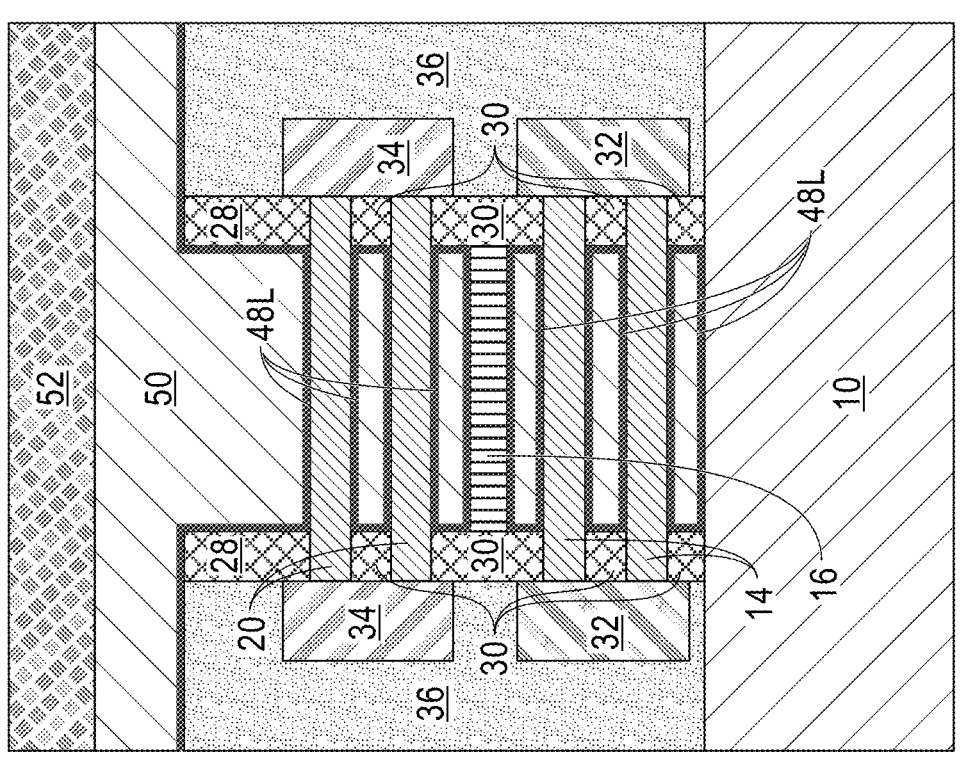

Referring now to FIGS. 8A, 8B and 8C, there are illustrated the exemplary semiconductor structure illustrated in FIGS. 7A, 7B and 7C, respectively, after forming a third block mask 52 in D1 and D2. Third block mask 52 includes one of the block mask materials mentioned above for the first block mask 38. The block mask material that provides the third block mask 52 can be compositionally the same as, or compositionally different from, the block mask material that provides the first block mask 38. Third block mask 52 can be formed utilizing the same technique as mentioned above in forming the first block mask 38. Within D1, the third block mask 52 is formed on the first gate replacement layer 42. Within D2, the third block mask 52 is formed on third block mask 52 is formed on the second gate replacement layer 50.

Figure 9A:
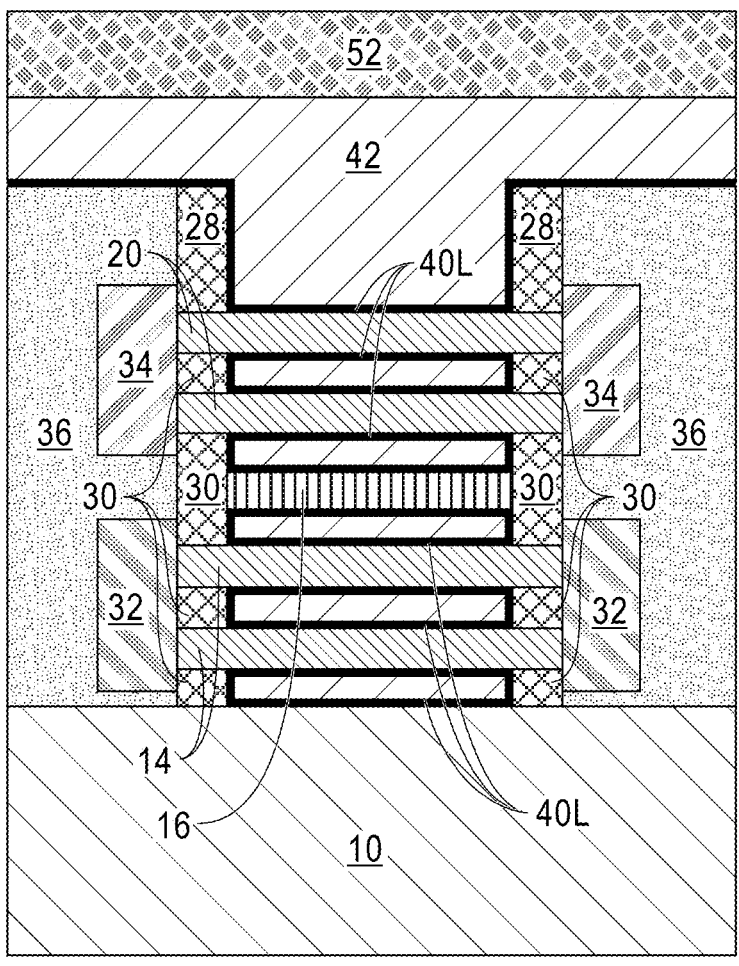
FIGS. 9A, 9B and 9C are cross sectional views of the exemplary semiconductor structure illustrated in FIGS. 8A, 8B and 8C, respectively, after removing the first block mask from D3 and nanosheet device processing in D3, the nanosheet device processing in D3 includes revealing the stacked first and second nanosheet material stacks, and removing each second sacrificial semiconductor material nanosheet and each first sacrificial semiconductor material nanosheet to form an opening in D3.
Figure 9C:
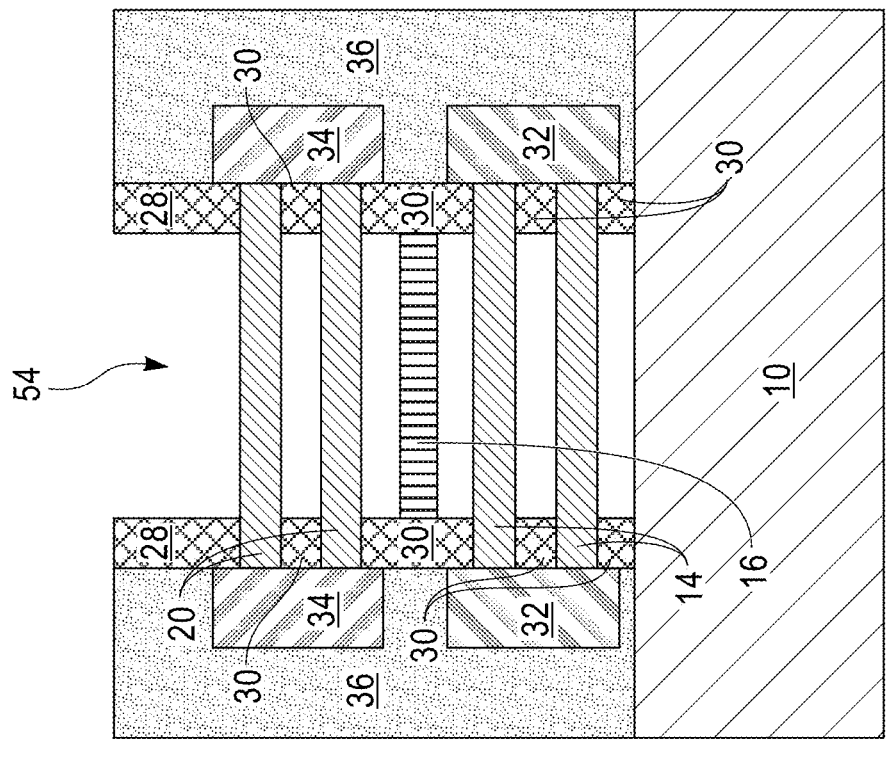
Figure 9B:
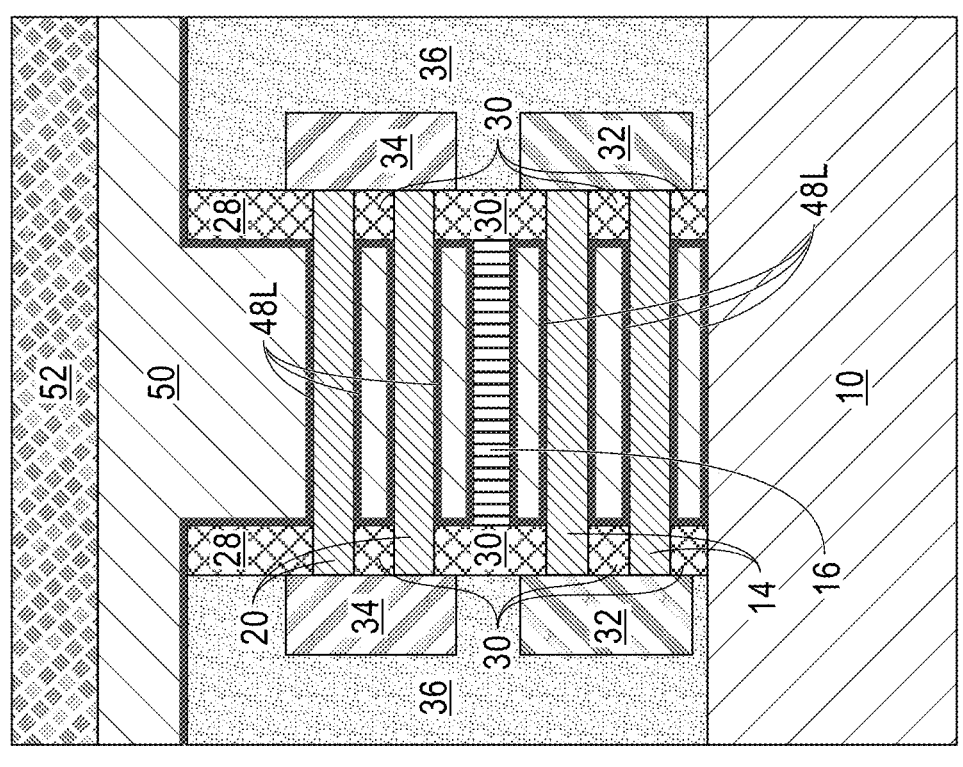

Referring now to FIGS. 9A, 9B and 9C, there are illustrated the exemplary semiconductor structure illustrated in FIGS. 8A, 8B and 8C, respectively, after removing the first block mask 38 from D3 and nanosheet device processing in D3, the nanosheet device processing in D3 includes removing the sacrificial gate structure to reveal the stacked first and second nanosheet material stacks, and removing each second sacrificial semiconductor material nanosheet 18 and each first sacrificial semiconductor material nanosheet 12 to form an opening 54 in D3.

First block mask 38 is removed from D3 utilizing an etching process that is selective in removing the first block mask 38 from D3. In some embodiments, the removal of the first block mask 38 from D3 occurs simultaneously with the removing of the blanket layer of hard mask material from D3 that provides the third block mask 52. In other embodiments, the removal of the first block mask 38 from D3 occurs utilizing a different material removal process, e.g., etching, then that was used to removing of the blanket layer of hard mask material from D3.

With the third block mask 52 present in D1 and D2, the nanosheet device processing in D3 includes first revealing the stacked first and second nanosheet material stacks present in D3. The revealing of the stacked first and second nanosheet material stacks present in D3 includes removing the sacrificial gate cap 26, if the same is present, and the sacrificial gate structure (including the optional sacrificial gate dielectric layer 22 and the sacrificial gate layer 24). The removal process includes one or more etching processes. The one or more etching processes can include RIE.

The removal of each second sacrificial semiconductor material nanosheet 18 and each first sacrificial semiconductor material nanosheet 12 from D3 includes any material removal process (such as, for example, etching) or combination of removal process (combination of two etching processes) which is (are) selective in removing the first sacrificial semiconductor material nanosheets 12 and the second sacrificial semiconductor material nanosheets 18. This removal step suspends a portion of each first semiconductor channel material nanosheet 14 and each second semiconductor channel material nanosheet 20 that are present in D3 and provides opening 54 in D3. Note that the middle dielectric isolation layer 16 is also suspended during this step of the present application.

Figure 10A:
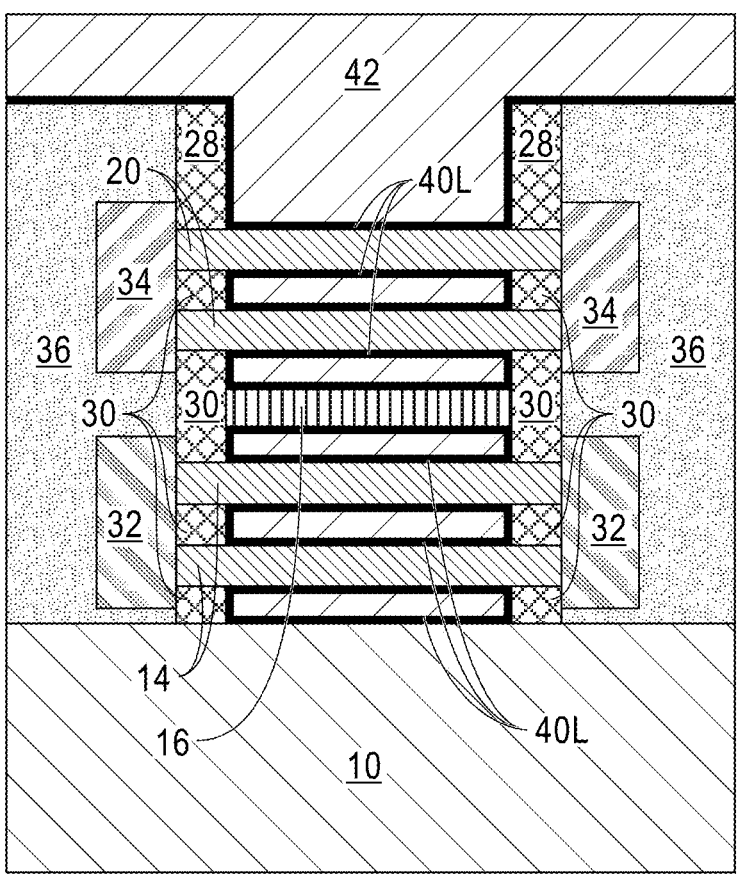
FIGS. 10A, 10B and 10C are cross sectional views of the exemplary semiconductor structure illustrated in FIGS. 9A, 9B and 9C, respectively, after removing the third block mask in D1 and D2, further nanosheet device processing in D3, the further nanosheet device processing in D3 includes thinning physically exposed portions of each of the first semiconductor channel material nanosheets and second semiconductor channel material nanosheets, forming a third interfacial dielectric layer and a third high-k gate dielectric layer, and forming a third gate replacement layer, and performing a third planarization process in D1, D2 and D3 to remove the third gate replacement layer and the third high-k gate dielectric layer from D1 and D2.
Figure 10C:
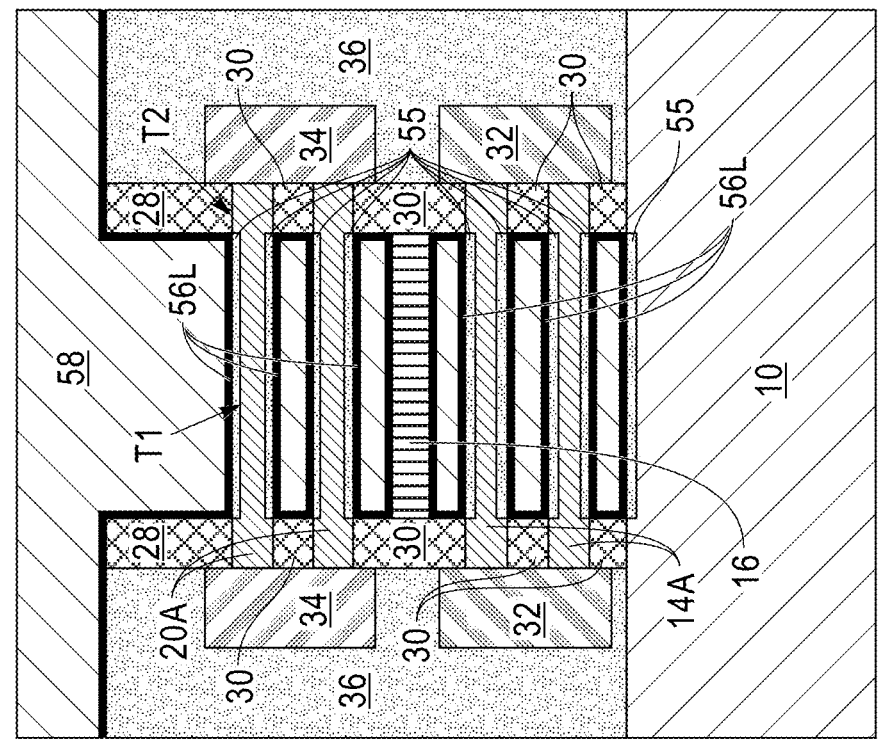
Figure 10B:
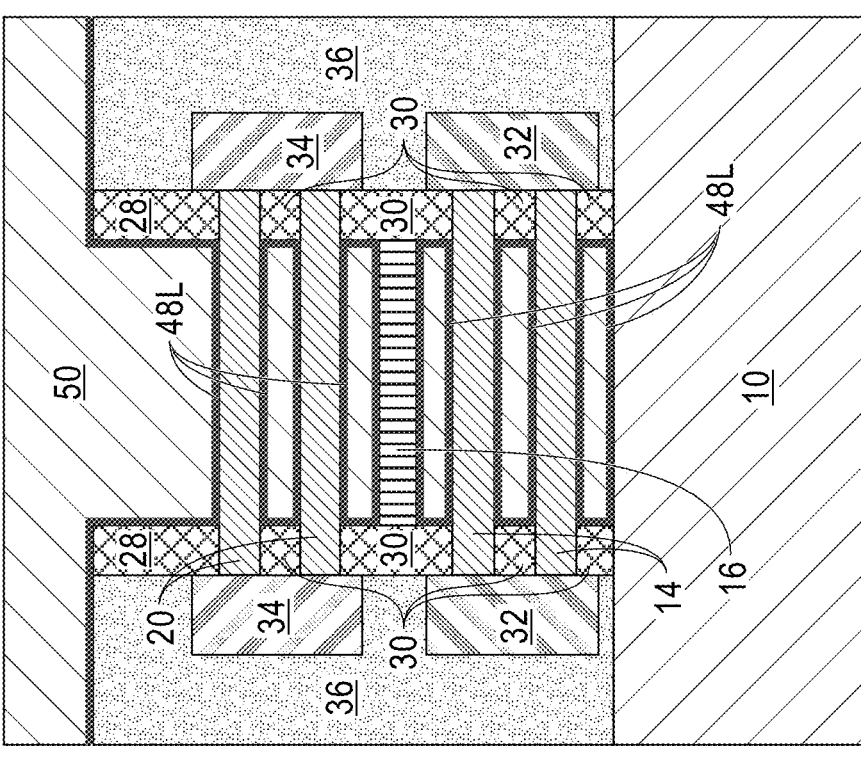

Referring now to FIGS. 10A, 10B and 10C, there are illustrated the exemplary semiconductor structure illustrated in FIGS. 9A, 9B and 9C, respectively, after removing the third block mask 52 in D1 and D2, further nanosheet device processing in D3, the further nanosheet device processing in D3 includes thinning physically exposed portions of each of the first semiconductor channel material nanosheets 14 and second semiconductor channel material nanosheets 20, forming a third interfacial dielectric layer 55 and a third high-k gate dielectric layer 56L, and forming a third gate replacement layer 58, and performing a third planarization process in D1, D2 and D3 to remove the third gate replacement layer 58 and the third high-k gate dielectric layer 56L from D1 and D2. The third block mask 52 is removed from D1 and D2 utilizing an etching process that is selective in removing the third block mask 52 from the structure.

The thinning of physically exposed portions of each of the first semiconductor channel material nanosheets 14 and second semiconductor channel material nanosheets 20 can include an oxidation process followed by an etch. The oxidation/etch can be repeating multiple times in thinning of the physically exposed portions of each of the first semiconductor channel material nanosheets 14 and second semiconductor channel material nanosheets 20. The thinning process provides dumbbell shaped first semiconductor channel material nanosheets 14A and dumbbell-shaped semiconductor channel material nanosheets 20A. The term "dumbbell shaped" denotes a material that has a middle portion that is thinner than end portions of that same material. In the present application, the dumbbell shaped semiconductor channel material nanosheets have a middle portion having a first thickness, T1, and end portions having a second thickness, T2, wherein T1 is less than T2. In some embodiments, the thinning step can be omitted.

Next, third interfacial dielectric layer 55 is formed around each of the first semiconductor channel material nanosheets 14 and the second semiconductor channel material nanosheets 20 and on a topmost surface of the semiconductor substrate 10 in D2. The third interfacial dielectric layer 55 is composed of a third semiconductor oxide such as for example silicon oxide. The semiconductor oxide of the third interfacial dielectric layer 55 would match the semiconductor material that is formed thereon. The third interfacial dielectric layer 55 in D3 has a third thickness. The third thickness of the third interfacial dielectric layer 55 in D3 is greater than the first thickness of the first interfacial layer and the second thickness of the second interfacial layer. The third interfacial dielectric layer 55 can be formed by a thermal oxidation process.

The third high-k gate dielectric layer 56L is then formed in each of D1, D2 and D3. In D1, the third high-k gate dielectric layer 56L is formed on the first gate replacement layer 42. In D2, the third high-k gate dielectric layer 48L is formed on the second gate replacement layer 50. In D3, the third high-k gate dielectric layer 56L is formed on and around the third interfacial dielectric layer 55 that is present on each suspended first and second semiconductor channel material nanosheets 14, 20, and the middle dielectric isolation layer 16 within opening 54. In D3, the third high-k gate dielectric layer 56L is also formed along an inner sidewall of the inner spacer 30 and along a topmost surface of semiconductor substrate 10 as well as atop the gate spacer 28 and ILD layer 36.

The third high-k gate dielectric layer 56L is a third high-k gate dielectric material. The third high-k gate dielectric material has a dielectric constant of greater than 4.0 Illustrative examples of third high-k gate dielectric materials include, but are not limited to, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite ($Pb(Zn,Nb)O$). The first high-k gate dielectric material can further include dopants such as lanthanum (La), aluminum (Al) and/or magnesium (Mg). The third high-k gate dielectric material that provides the third high-k gate dielectric layer 56L can be compositionally the same as, or compositionally different from, the first high-k gate dielectric material that provides the first high-k gate dielectric layer 40L and/or the second high-k gate dielectric material that provides the second high-k gate dielectric layer 48L.

The third high-k gate dielectric layer 56L can be formed by a deposition process including, but not limited to, CVD, PECVD or ALD. The third high-k gate dielectric layer 56L can have a third high-k gate dielectric thickness. The third high-k gate dielectric thickness can be equal to, lesser than or greater than the first high-k gate dielectric thickness and/or the second high-k gate dielectric thickness.

The third gate replacement layer 58 is then formed in each of D1, D2 and D3. In each of D1, D2 and D3, the third gate replacement layer 58 is formed on a surface of the third high-k gate dielectric layer 56L. Note that within D3, the third gate replacement layer 58 fills in the gap between each suspended each suspended first and second semiconductor channel material nanosheets 14, 20, and between the suspended middle dielectric isolation layer 16. The third gate replacement layer 58 can include one of the sacrificial gate materials mentioned above for the sacrificial gate layer 24 of the sacrificial gate structure. The third gate replacement layer 50 can be compositionally the same as, or compositionally different from, the first gate replacement layer 42 and/or the second gate replacement layer 50. In some embodiments, each of the first gate replacement layer 42, the second gate replacement layer 50 and the third gate replacement layer 58 is composed of a compositionally same sacrificial gate material. Such embodiments provide case in the manufacturing process since a single etch can be used to remove each first gate replacement layer 42, the second gate replacement layer 50 and the third gate replacement layer 58. Such embodiments can permit the formation of a same gate electrode material in each of D1, D2 and D3. In other embodiments, each of the first gate replacement layer 42, the second gate replacement layer 50 and the third gate replacement layer 58 is composed of a compositionally different sacrificial gate material. Such embodiments permit the formation of gate structures in each of D1, D2 and D3 having different gate electrode materials. The third gate replacement layer 58 can be formed by a deposition process including, but not limited to, CVD, PECVD or ALD.

A third planarization process in D1, D2 and D3 to remove the third gate replacement layer 58 and the third high-k gate dielectric layer 56L from D1 and D2. This third planarization process can also remove an upper portion of the third gate replacement layer 58 from D3. The third planarization process can include CMP or grinding. Within D1, the third planarization process reveals the first gate replacement layer 42. Within D2, the third planarization process reveals the second gate replacement layer 50. Within D3, the third planarization process reveals the third gate replacement layer 58.

In some embodiments of the present application, a dielectric anneal step can now be performed. In other embodiments of the present application, the dielectric anneal step can be omitted. When performed, the dielectric anneal reduces the defects that are present in each of the high-k gate dielectric layers, i.e., the first high-k gate dielectric layer 40L, the second high-k gate dielectric layer 48L and the third high-k gate dielectric layer 56L. The dielectric anneal step can be performed in an ambient such as, for example, helium, argon, and/or neon. The dielectric anneal step can be performed at a temperature from 700° C. to 1000° C.

Figure 11A:
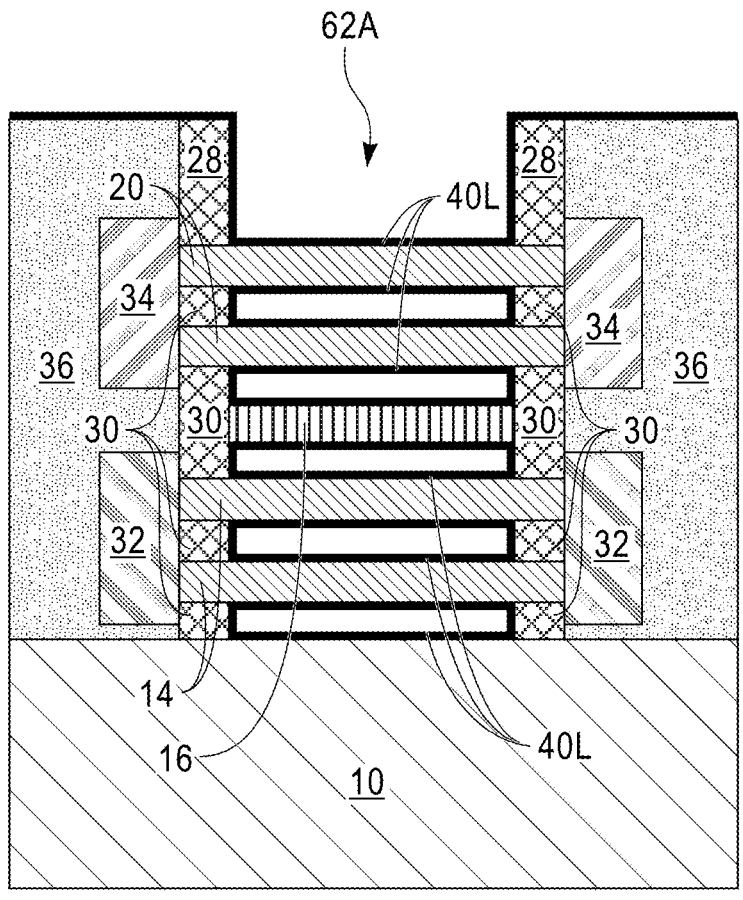
FIGS. 11A, 11B and 11C are cross sectional views of the exemplary semiconductor structure illustrated in FIGS. 10A, 10B and 10C, respectively, after removing the first gate replacement layer from D1, the second gate replacement layer from D2, and the third gate replacement layer from D3.
Figure 11C:
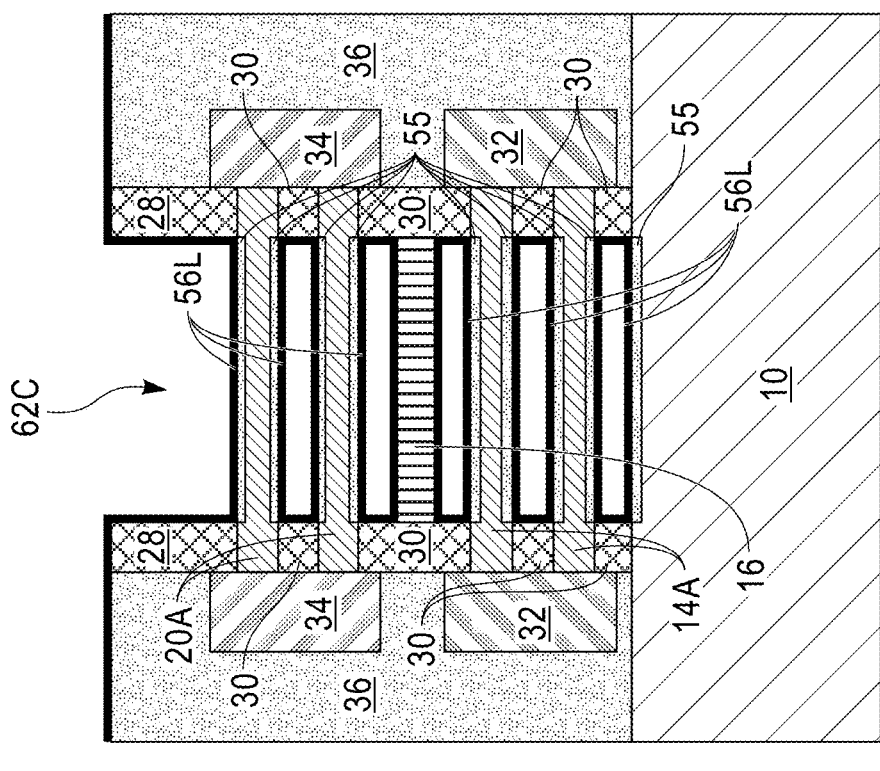
Figure 11B:
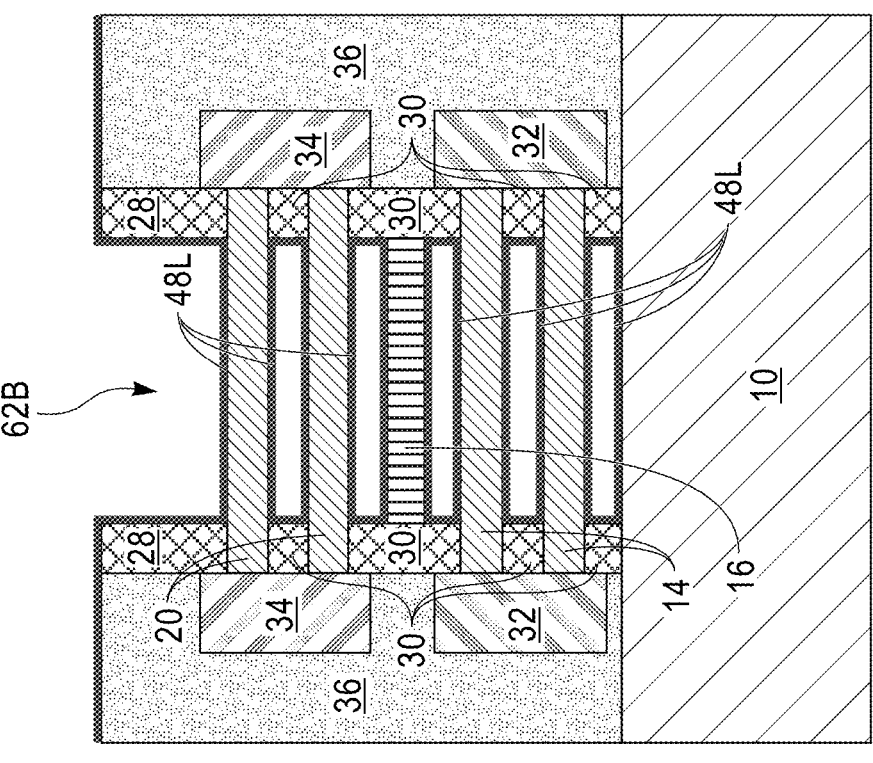

Referring now to FIGS. 11A, 11B and 11C are cross sectional views of the exemplary semiconductor structure illustrated in FIGS. 10A, 10B and 10C, respectively, after removing the first gate replacement layer 42 from D1, the second gate replacement layer 50 from D2, and the third gate replacement layer 58 from D3. The removal of the first gate replacement layer 42 from D1, the second gate replacement layer 50 from D2, and the third gate replacement layer 58 from D3 can be performed utilizing one or more etching processes. In embodiments (as illustrated) in which the first gate replacement layer 42, the second gate replacement layer 50 and the third gate replacement layer 58 are composed of a compositionally same sacrificial gate material, a single etch can be used to remove each of the first gate replacement layer 42, the second gate replacement layer 50 and the third gate replacement layer 58. In embodiments (not shown) in which the first gate replacement layer 42, the second gate replacement layer 50 and the third gate replacement layer 58 are composed of a compositionally different sacrificial gate materials, multiple etching processes can be used to remove each of the first gate replacement layer 42, the second gate replacement layer 50 and the third gate replacement layer 58. In D1, first gate opening 62A is formed by this step. In D2, second gate opening 62B is formed. In D3, third gate opening 62C is formed by this step. When multiple etching is used, the gate electrode can be formed in one of the device regions, prior to removing the gate replacement layers from the other device regions.

Referring now to FIGS. 12A, 12B and 12C, there are illustrated the exemplary semiconductor structure illustrated in FIGS. 11A, 11B and 11C, respectively, after forming a first gate electrode 64A in D1, a second gate electrode 64B in D2 and a third gate electrode 64C in D3. Each of the first gate electrode 64A, second gate electrode 64B, and third gate electrode 64C is composed of gate electrode material. In some embodiments, the gate electrode material for first gate electrode 64A, second gate electrode 64B, and third gate electrode 64C is a compositionally same material. In other embodiments the gate electrode material of the first gate electrode 64A can be compositionally different than the gate electrode material for the second gate electrode 64B and/or the third gate electrode 64C.

The gate electrode material can include a work function metal (WFM) and optionally a conductive metal. The WFM can be used to set a threshold voltage of the transistor to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The optional conductive metal can include, but is not limited to aluminum (Al), tungsten (W), or cobalt (Co). The first gate electrode 64A, second gate electrode 64B, and third gate electrode 64C can be formed by deposition of the gate electrode material, followed by a planarization process. Note that the gate electrode material wraps around each of the suspended first and second semiconductor channel material nanosheets 14, 20 as well as around the middle dielectric isolation layer 16.

Figure 13C:
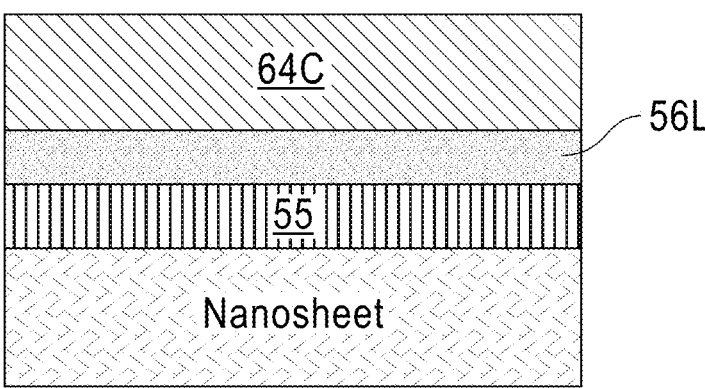

Referring now to FIGS. 13A, 13B and 13C, there are cross sectional views representing a portion of the gate region that is present in each of D1, D2 and D3. In D1, the gate region includes a semiconductor nanosheet (either the first semiconductor material nanosheet 14 or the second semiconductor material nanosheet 20), a first interlayer dielectric layer, IL-1, the first high-k gate dielectric layer 40L, and the first gate electrode 64A. Note that the first interlayer dielectric layer, IL-1, the first high-k gate dielectric layer 40L, and the first gate electrode 64A would wrap around the semiconductor nanosheet. In D2, the gate region includes a semiconductor nanosheet (either the first semiconductor material nanosheet 14 or the second semiconductor material nanosheet 20), a second interlayer dielectric layer, IL-2, the second high-k gate dielectric layer 48L, and the second gate electrode 64B. Note that the second interlayer dielectric layer, IL-2, the second high-k gate dielectric layer 48L, and the second gate electrode 64B would wrap around the semiconductor nanosheet. In D3, the gate region includes a semiconductor nanosheet (either the first semiconductor material nanosheet 14 or the second semiconductor material nanosheet 20), the third first interlayer dielectric layer 55, the third high-k gate dielectric layer 56L, and the third gate electrode 64C. Note that the third interlayer dielectric layer 55, the third high-k gate dielectric layer 56L, and the third gate electrode 64C would wrap around the semiconductor nanosheet.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a first device region comprising a first pair of logic devices stacked one on top the other and having a first threshold voltage, wherein the first pair of logic devices comprise a first gate region comprising a first interfacial dielectric layer having a first thickness, a first high-k gate dielectric layer located on the first interfacial dielectric layer and a first gate electrode located on the first high-k gate dielectric layer;
a second device region comprising a second pair of logic devices stacked one on top the other and having a second threshold voltage which is different from the first threshold voltage, wherein the second pair of logic devices comprise a second interfacial dielectric layer having a second thickness, a second high-k gate dielectric layer located on the second interfacial dielectric layer and a second gate electrode located on the second high-k gate dielectric layer, wherein the second high-k gate dielectric layer has a thickness that is greater than a thickness of the first high-k gate dielectric layer; and
a third device region comprising a pair of I/O devices stacked one on top the other, wherein the pair of I/O devices comprise a third interfacial dielectric layer having a third thickness, a third high-k gate dielectric layer located on the third interfacial dielectric layer and a third gate electrode located on the third high-k gate dielectric layer, wherein the third thickness of the third interfacial dielectric layer is greater than the first thickness of the first interfacial dielectric layer and the second thickness of the second interfacial dielectric layer.

2. The semiconductor structure of claim 1, wherein the first pair of logic devices comprise a first nanosheet stack containing at least one second semiconductor channel material nanosheet located above at least one first semiconductor channel material nanosheet, and wherein the first interfacial dielectric layer wraps around a portion of the at least one second semiconductor channel material nanosheet of the first nanosheet stack and a portion of the at least one first semiconductor material nanosheet of the first nanosheet stack,
the second pair of logic devices comprise a second nanosheet stack containing at least one second semiconductor channel material nanosheet located above at least one first semiconductor channel material nanosheet, wherein the second interfacial dielectric layer wraps around a portion of the at least one second semiconductor channel material nanosheet of the second nanosheet stack and a portion of the at least one first semiconductor material nanosheet of the second nanosheet stack, and
the pair of I/O devices comprise a third nanosheet stack containing at least one second semiconductor channel material nanosheet located above at least one first semiconductor channel material nanosheet, wherein the third interfacial dielectric layer wraps around a portion of the at least one second semiconductor channel material nanosheet of the third nanosheet stack and a portion of the at least one first semiconductor material nanosheet of the third nanosheet stack.

3. The semiconductor structure of claim 2, further comprising a middle dielectric isolation layer located between the at least one first semiconductor channel material nanosheet and the at least one second semiconductor channel material nanosheet in each of the first nanosheet stack, the second nanosheet stack and the third nanosheet stack.

4. The semiconductor structure of claim 2, wherein the at least one first semiconductor material channel nanosheet of the third nanosheet stack and the at least one second semiconductor channel material nanosheet of the third nanosheet stack are dumbbell shaped having a middle portion of a first thickness and end portions of a second thickness, wherein the second thickness is greater than the first thickness and wherein the third interfacial dielectric layer wraps around the middle portion.

5. The semiconductor structure of claim 1, wherein each of the first device region, the second device region and the third device region is present on a same semiconductor substrate.

6. The semiconductor structure of claim 1, wherein the first gate electrode, the second gate electrode and the third gate electrode are composed of a compositionally same gate electrode material.

7. The semiconductor structure of claim 1, wherein at least one of the first gate electrode, the second gate electrode and the third gate electrode is composed of a compositionally different gate electrode material.

8. The semiconductor structure of claim 1, wherein the first high-k gate dielectric layer, the second high-k gate dielectric layer, and the third high-k gate dielectric layer are composed of a compositionally same high-k gate dielectric material.

9. The semiconductor structure of claim 1, wherein at least one the first high-k gate dielectric layer, the second high-k gate dielectric layer, and the third high-k gate dielectric layer composed of a compositionally different high-k gate dielectric material.

10. The semiconductor structure of claim 1, wherein each logic device of the first pair of logic devices is of a different conductivity type, each logic device of the second pair of logic devices is of a different conductivity type, and each I/O device of the pair of I/O devices is of a different conductivity type.

11. A semiconductor structure comprising:
a first device region comprising a first pair of logic devices stacked one on top the other and having a first threshold voltage, wherein the first pair of logic devices comprise a first gate region comprising a first interfacial dielectric layer having a first thickness, a first high-k gate dielectric layer located on the first interfacial dielectric layer and a first gate electrode located on the first high-k gate dielectric layer;
a second device region comprising a second pair of logic devices stacked one on top the other and having a second threshold voltage which is different from the first threshold voltage, wherein the second pair of logic devices comprise a second interfacial dielectric layer having a second thickness, a second high-k gate dielectric layer located on the second interfacial dielectric layer and a second gate electrode located on the second high-k gate dielectric layer; and
a third device region comprising a pair of I/O devices stacked one on top the other, wherein the pair of I/O devices comprise a third interfacial dielectric layer having a third thickness, a third high-k gate dielectric layer located on the third interfacial dielectric layer and a third gate electrode located on the third high-k gate dielectric layer, wherein the third thickness of the third interfacial dielectric layer is greater than the first thickness of the first interfacial dielectric layer and the second thickness of the second interfacial dielectric layer, and wherein at least one of the first high-k gate dielectric layer, the second high-k gate dielectric layer and the third high-k gate dielectric layer is composed of a compositionally different high-k gate dielectric material, wherein:
the first pair of logic devices comprise a first nanosheet stack containing at least one second semiconductor channel material nanosheet located above at least one first semiconductor channel material nanosheet, and wherein the first interfacial dielectric layer wraps around a portion of the at least one second semiconductor channel material nanosheet of the first nanosheet stack and a portion of the at least one first semiconductor material nanosheet of the first nanosheet stack,
the second pair of logic devices comprise a second nanosheet stack containing at least one second semiconductor channel material nanosheet located above at least one first semiconductor channel material nanosheet, wherein the second interfacial dielectric layer wraps around a portion of the at least one second semiconductor channel material nanosheet of the second nanosheet stack and a portion of the at least one first semiconductor material nanosheet of the second nanosheet stack, and
the pair of I/O devices comprise a third nanosheet stack containing at least one second semiconductor channel material nanosheet located above at least one first semiconductor channel material nanosheet, wherein the third interfacial dielectric layer wraps around a portion of the at least one second semiconductor channel material nanosheet of the third nanosheet stack and a portion of the at least one first semiconductor material nanosheet of the third nanosheet stack, and the at least one first semiconductor material channel nanosheet of the third nanosheet stack and the at least one second semiconductor channel material nanosheet of the third nanosheet stack are dumbbell shaped having a middle portion of a first thickness and end portions of a second thickness, wherein the second thickness is greater than the first thickness, and wherein the third interfacial dielectric layer wraps around the middle portion.

12. The semiconductor structure of claim 11, wherein each of the first device region, the second device region and the third device region is present on a same semiconductor substrate.

13. The semiconductor structure of claim 11, wherein the first gate electrode, the second gate electrode and the third gate electrode are composed of a compositionally same gate electrode material.

14. The semiconductor structure of claim 11, wherein each of the first high-k gate dielectric layer, the second high-k gate dielectric layer, and the third high-k gate dielectric layer is composed of a compositionally different high-k gate dielectric material.

15. The semiconductor structure of claim 11, wherein each logic device of the first pair of logic devices is of a different conductivity type, each logic device of the second pair of logic devices is of a different conductivity type, and each I/O device of the pair of I/O devices is of a different conductivity type.

16. The semiconductor structure of claim 11, wherein the third thickness of the third interfacial dielectric layer is greater than the first thickness of the first interfacial dielectric layer and the second thickness of the second interfacial dielectric layer.

17. A semiconductor structure comprising:
a first device region comprising a first pair of logic devices stacked one on top the other and having a first threshold voltage, wherein the first pair of logic devices comprise a first gate region comprising a first interfacial dielectric layer having a first thickness, a first high-k gate dielectric layer located on the first interfacial dielectric layer and a first gate electrode located on the first high-k gate dielectric layer;
a second device region comprising a second pair of logic devices stacked one on top the other and having a second threshold voltage which is different from the first threshold voltage, wherein the second pair of logic devices comprise a second interfacial dielectric layer having a second thickness, a second high-k gate dielectric layer located on the second interfacial dielectric layer and a second gate electrode located on the second high-k gate dielectric layer; and
a third device region comprising a pair of I/O devices stacked one on top the other, wherein the pair of I/O devices comprise a third interfacial dielectric layer having a third thickness, a third high-k gate dielectric layer located on the third interfacial dielectric layer and a third gate electrode located on the third high-k gate dielectric layer, wherein the third thickness of the third interfacial dielectric layer is greater than the first thickness of the first interfacial dielectric layer and the second thickness of the second interfacial dielectric layer, and wherein at least one of the first high-k gate dielectric layer, the second high-k gate dielectric layer and the third high-k gate dielectric layer is composed of a compositionally different high-k gate dielectric material, and wherein at least one of the first gate electrode, the second gate electrode and the third gate electrode is composed of a compositionally different gate electrode material.

18. The semiconductor structure of claim 17, wherein the first pair of logic devices comprise a first nanosheet stack containing at least one second semiconductor channel material nanosheet located above at least one first semiconductor channel material nanosheet, and wherein the first interfacial dielectric layer wraps around a portion of the at least one second semiconductor channel material nanosheet of the first nanosheet stack and a portion of the at least one first semiconductor material nanosheet of the first nanosheet stack, the second pair of logic devices comprise a second nanosheet stack containing at least one second semiconductor channel material nanosheet located above at least one first semiconductor channel material nanosheet, wherein the second interfacial dielectric layer wraps around a portion of the at least one second semiconductor channel material nanosheet of the second nanosheet stack and a portion of the at least one first semiconductor material nanosheet of the second nanosheet stack, and the pair of I/O devices comprise a third nanosheet stack containing at least one second semiconductor channel material nanosheet located above at least one first semiconductor channel material nanosheet, wherein the third interfacial dielectric layer wraps around a portion of the at least one second semiconductor channel material nanosheet of the third nanosheet stack and a portion of the at least one first semiconductor material nanosheet of the third nanosheet stack.

19. The semiconductor structure of claim 18, further comprising a middle dielectric isolation layer located between the at least one first semiconductor channel material nanosheet and the at least one second semiconductor channel material nanosheet in each of the first nanosheet stack, the second nanosheet stack and the third nanosheet stack.

20. The semiconductor structure of claim 17, wherein the at least one first semiconductor material channel nanosheet of the third nanosheet stack and the at least one second semiconductor channel material nanosheet of the third nanosheet stack are dumbbell shaped having a middle portion of a first thickness and end portions of a second thickness, wherein the second thickness is greater than the first thickness, and wherein the third interfacial dielectric layer wraps around the middle portion.

* * * * *